United States Patent
Shutoh et al.

(10) Patent No.: US 8,637,758 B2
(45) Date of Patent: Jan. 28, 2014

(54) THERMOELECTRIC MATERIAL AND THERMOELECTRIC ELEMENT

(75) Inventors: Naoki Shutoh, Yokohama (JP); Shinya Sakurada, Tokyo (JP); Naruhito Kondo, Kawasaki (JP); Nobuhisa Takezawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/279,768

(22) Filed: Oct. 24, 2011

(65) Prior Publication Data

US 2012/0037199 A1 Feb. 16, 2012

Related U.S. Application Data

(62) Division of application No. 10/629,624, filed on Jul. 30, 2003, now Pat. No. 8,067,686.

(30) Foreign Application Priority Data

Nov. 12, 2002 (JP) ................ 2002-328628
Mar. 28, 2003 (JP) ................ 2003-090186
Jul. 24, 2003 (JP) ................ 2003-201294

(51) Int. Cl.
*H01L 35/20* (2006.01)

(52) U.S. Cl.
USPC .......................... 136/239; 136/240

(58) Field of Classification Search
USPC ............... 136/200–242; 252/62.3 T
See application file for complete search history.

(56) References Cited

U.S. PATENT DOCUMENTS

| 6,700,052 B2 * | 3/2004 | Bell ............................ 136/201 |
| 6,759,586 B2 | 7/2004 | Shutoh et al. |
| 7,663,054 B2 | 2/2010 | Shutoh et al. |

FOREIGN PATENT DOCUMENTS

| JP | 2001-189495 | 7/2001 |
| JP | 2002-33527 | 1/2002 |

OTHER PUBLICATIONS

Sportouch et al., "Thermoelectric properties of Half-Heusler Phases: ErNi1-xCuxSb and YNi1-xCuxSb and ZrxHfyTizNiSn" IEEE, 18th International Conference on Thermoelectrics, 1999, pp. 344-347.*

Xia et al., "Thermoelectric properties of semimetallic (Zr, Hf)CoSb half-Heusler phases" Journal of Applied Physics, vol. 88, No. 4, Aug. 15, 2000, pp. 1952-1955.*

Romaka et al., "MgAgAs structure type solid solutions as a new thermoelectric material" IEEE, 16th International Conference on Thermoelectrics, 1997, pp. 516-519.*

S. Sportouch, et al., "Thermoelectric Properties of Half-Heusler Phases:ErNi$_{1-x}$Cu$_x$Sb And Zr$_x$Hf$_y$Ti$_z$NiSn", 18$^{th}$ International Conference on Thermoelectrics Proceedings, ICT' 99, Aug. 1999, pp. 344-347.

(Continued)

*Primary Examiner* — Alicia Bland
*Assistant Examiner* — Niki Bakhtiari
(74) *Attorney, Agent, or Firm* — Oblon, Spivak, McClelland, Maier & Neustadt, L.L.P.

(57) ABSTRACT

Disclosed is a thermoelectric material which is represented by the following composition formula (1) or (2) and comprises as a major phase an MgAgAs type crystal structure:

$(Ti_{a1}Zr_{b1}Hf_{c1})_xNi_ySn_{100-x-y}$    composition formula (1);

$(Ln_d(Ti_{a2}Zr_{b2}Hf_{c2})_{1-d})_xNi_ySn_{100-x-y}$    composition formula (2);

(wherein a1, b1, c1, x and y satisfy the conditions of: $0<a1<1$, $0<b1<1$, $0<c1<1$, $a1+b1+c1=1$, $30 \leq x \leq 35$ and $30 \leq y \leq 35$, and Ln is at least one element selected from the group consisting of Y and rare earth elements, and a2, b2, c2 and d satisfy the conditions of: $0 \leq a2 \leq 1$, $0 \leq b2 \leq 1$, $0 \leq c2 \leq 1$, $a2+b2+c2=1$ and $0<d \leq 0.3$).

10 Claims, 2 Drawing Sheets

(56) References Cited

OTHER PUBLICATIONS

S. J. Poon, et al., "Bandgap Features and Thermoelectric Properties of Ti-Based Half-Heusler Alloys" 18th International Conferences on Thermoelectrics Proceedings, ICT' 99, Aug. 1999, pp. 45-51.

C. Uher, et al., "Thermoelectric Properties of Bi-Doped Half-Heusler Alloys", 18th International Conference on Thermoelectrics Proceedings, ICT' 99, Aug. 1999, pp. 56-59.

S. Bhattacharya, et al., "Thermoelectric Properties of Sb-Doping in the $TiNiSn_{1-x}Sb_x$ Half-Heusler System", 18th International Conference on Thermoelectrics Proceedings, ICT' 99, Aug. 1999, pp. 336-339.

Y. Xia, et al., "Thermoelectric Properties of semimetallic (Zr, Hf)CoSb half-Heusler phases", Journal of Applied Physics, vol. 88, No. 4, Aug. 15, 2000, pp. 1952-1955.

S. Bhattacharya, et al., "Effect of Sb doping on the thermoelectric properties of Ti-based half-Heusler compounds, $TiNiSn_{1-x} Sb_x$", Applied Physics Letters, vol. 77, No. 16, Oct. 16, 2000, pp. 2476-2478.

Q. Shen, et al., "Effects of partial substitution of Ni by Pd on the thermoelectric properties of ZrNiSn-based half-Heusler compounds", Applied Physics Letters, vol. 79, No. 25, Dec. 17, 2001, pp. 4165-4167.

Qiang Shen, et al., "Thermoelectric Properties of ZrNiSn-based half-Heusler compounds by solid state reaction method", Journal of Materials Science Letters, vol. 20, No. 24, Dec. 2001, pp. 2197-2199.

S. Joseph Poon, et al., "Electronic and Thermoelectric Properties of Half-Heusler Alloys", Semiconductors and Semimetals, Academic Press, vol. 70, 2001, pp. 37-75.

Shen Qiang, et al., Synthesis and Thermoelectric Properties of ZrNiSn-based Semi-Heusler Compounds, Preprints of Annual Meeting of The Ceramic Society of Japan, Mar. 21, 2001, p. 285.

H. Hohl, et al., J. Phys.: Condens., matter 11, pp. 1697-1709, "Efficient Dopants for ZrNiSn-Based Thermoelectric Materials", 1999.

K. Mastronardi, et al., Applied Physics Letters, vol. 74, No. 10, pp. 1415-1417, "Antimonides With the Half-Heusler Structure: New Thermoelectric Materials", Mar. 8, 1999.

Shen, Q., Zhang, L.M., Chen, L. D., Goto, T. and Hirai, T., Synthesis and Sintering of ZrNiSn Thermoelectric Compounds, 21st International Conference on Thermoelectrics, Aug. 25-29, 2002, pp. 166-169.

* cited by examiner

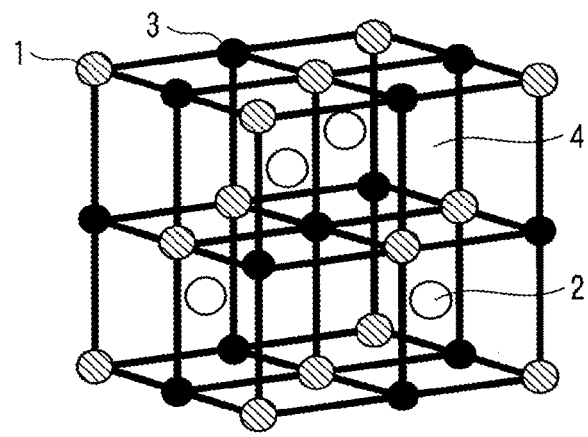
F I G. 1
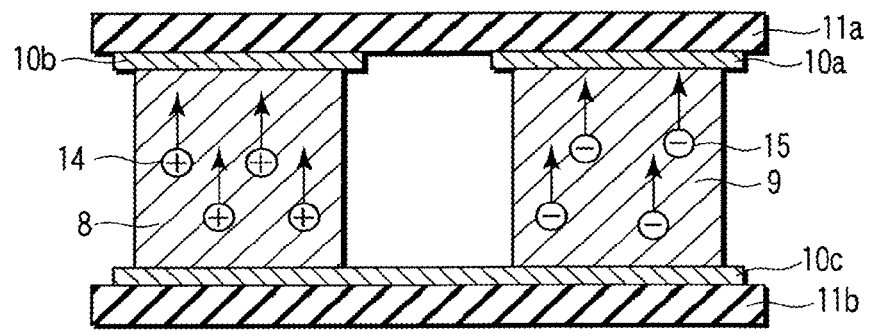
F I G. 2
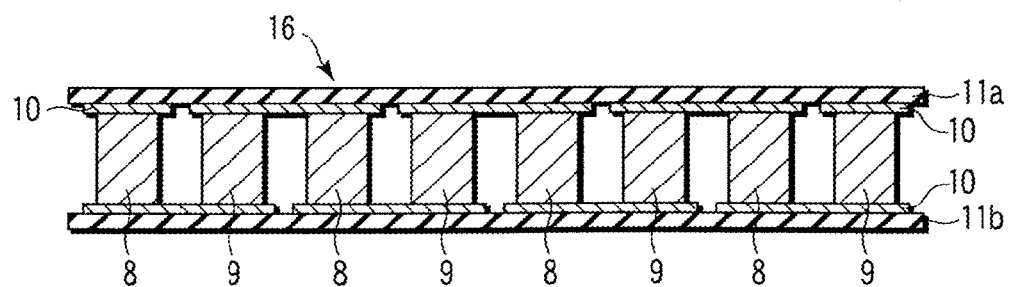
F I G. 3

THERMOELECTRIC MATERIAL AND THERMOELECTRIC ELEMENT

CROSS-REFERENCE TO RELATED APPLICATIONS

This application is a divisional of and claims the benefit of priority from U.S. Ser. No. 10/629,624, filed Jul. 30, 2003, which claims the benefit of priority from Japanese Patent Application Nos. 2002-328628, filed Nov. 12, 2002; No. 2003-090186, filed Mar. 28, 2003; and No. 2003-201294, filed Jul. 24, 2003, the entire contents of each of which are incorporated herein by reference.

BACKGROUND OF THE INVENTION

1. Field of the Invention

The present invention relates to a thermoelectric material, and in particular, to a thermoelectric material comprising, as a major phase, a half Heusler compound having an MgAgAs type crystal structure. The present invention also relates to a thermoelectric element formed by using of this thermoelectric material.

2. Description of the Related Art

In recent years, concomitant with the awareness of issues with respect to global environmental problems, there is increasing concern about a thermoelectric cooling element utilizing Peltier effect for achieving flon-less cooling. Likewise, there is also increasing concern about a thermoelectric generating element which is capable of directly converting unutilized waste heat energy into electric energy for the purpose of minimizing the quantity of carbon dioxide discharged into the atmosphere, in view of overcoming the problem of global warming.

As for the p-type or n-type thermoelectric cooling materials and thermoelectric power-generating materials to be employed for the manufacture of the thermoelectric elements, materials having a Bi—Te-based monocrystalline or polycrystalline structure are widely employed because of their excellent conversion efficiency. Even in the case of the thermoelectric materials to be employed under high-temperature conditions higher than room temperature, Pb—Te-based materials are employed for any of these p-type or n-type thermoelectric cooling materials and thermoelectric power-generating materials.

Pb (lead) included in the Pb—Te-based materials is noxious and hazardous to the human body and also undesirable in view of the global environmental problem. In the Bi—Te-based materials, Se is generally included as an impurity, which is also toxic to the human body. In view of the global environmental problem also, the inclusion of Se is undesirable. Te, which is employed in these material systems, is very scarce in deposits in the earth and hence it is difficult to supply it in sufficient amounts. Therefore, it is greatly desired to develop a thermoelectric material which is higher in conversion efficiency as compared with the aforementioned Bi—Te-based materials or Pb—Te-based materials, and is harmless to the human body.

The half Heusler compounds can be represented by a chemical formula ABX and is an intermetallic compound having an MgAgAs type cubic crystal structure wherein the B atom is inserted into the NaCl type crystal lattice of AX. The compounds having a structure of this type exhibit a high Seebeck coefficient at room temperature. For example, it is reported that TiNiSn exhibits a Seebeck coefficient of −142 µV/K, ZrNiSn exhibits −176 µV/K, and HfNiSn exhibits −124 µV/K.

Incidentally, the performance index Z of the thermoelectric material can be represented by the following formula.

$$Z = \alpha^2 \sigma / \kappa \quad (1)$$

In this formula (1), $\alpha$ is the Seebeck coefficient of thermoelectric material; $\sigma$ is electric conductivity; and $\kappa$ is thermal conductivity. The inverse number of electric conductivity can be represented by electrical resistivity $\rho$.

Z may have a dimension which is an inverse to temperature, and when this performance index Z is multiplied by an absolute temperature, it becomes a dimensionless number. Namely, this dimensionless number ZT is called "a dimensionless figure-of-merit" and is correlated with the thermoelectric conversion efficiency of thermoelectric materials in such a way that the larger the value of this ZT of the materials becomes, the higher the thermoelectric conversion efficiency will be realized by the materials. Namely, as the materials become more difficult in transmitting heat, but become easier in transmitting electricity, enabling the materials to exhibit a larger thermoelectromotive force, the materials become a thermoelectric material which is capable of exhibiting a higher thermoelectric conversion efficiency. For example, in the case of the Bi—Te-based materials which are known to exhibit the highest dimensionless figure-of-merit among the known thermoelectric materials, the dimensionless figure-of-merit thereof is about 1.0 at a temperature of 300K.

Although the aforementioned half Heusler compound ZrNiSn is capable of exhibiting a Seebeck coefficient of as high as −176 µV/K at room temperature, the electrical resistivity thereof at room temperature is as high as 11 mΩcm and still more, the heat conductivity thereof is as high as 8.8 W/mK. As a result, it is reported that the dimensionless figure-of-merit ZT of the ZrNiSn is as small as 0.010 and hence the thermoelectric conversion efficiency thereof is also small. In the cases of TiNiSn and HfNiSn, the thermoelectric conversion efficiency thereof is more inferior, i.e. about 0.007 for TiNiSn and 0.005 for HiNiSn.

Meanwhile, as for the half Heusler compound containing a rare earth element, there is known for instance HoPdSb. The Seebeck coefficient of HoPdSb is 150 µV/K at room temperature. Although the heat conductivity of HoPdSb is 6 W/mK, which is slightly smaller than that of the ZrNiSn, the electrical resistivity thereof at room temperature is as high as 9 mΩ·cm and hence the dimensionless figure-of-merit ZT of HoPdSb is only 0.01. It is also reported that the dimensionless figure-of-merit at room temperature of $Ho_{0.5}Er_{0.5}PbSb_{1.05}$, $Er_{0.25}Dy_{0.75}Pb_{1.02}Sb$ and $Er_{0.25}Dy_{0.75}PbSb_{1.05}$ is 0.04, 0.03 and 0.02, respectively.

The present invention has been achieved in view of the aforementioned problems and hence, one object of the present invention is to provide a thermoelectric material comprising as a major phase, a half Heusler compound, this thermoelectric material being capable of exhibiting a high dimensionless figure-of-merit ZT while making it possible to sufficiently suppress the heat conductivity and to maintain a high Seebeck coefficient and a low electric resistivity. Another object of the present invention is to provide a thermoelectric element obtained by using such a thermoelectric material.

BRIEF SUMMARY OF THE INVENTION

According to one aspect of the present invention, there is provided a thermoelectric material which is represented by the following composition formula (1) and comprises as a major phase an MgAgAs type crystal structure:

$$(Ti_{a1}Zr_{b1}Hf_{c1})_x Ni_y Sn_{100-x-y} \quad \text{composition formula (1)};$$

(wherein a1, b1, c1, x and y satisfy the conditions of: $0 < a1 < 1$, $0 \leq b1 < 1$, $0 < c1 < 1$, $a1+b1+c1=1$, $30 \leq x \leq 35$ and $30 \leq y \leq 35$).

According to another aspect of the present invention, there is provided a thermoelectric material which is represented by the following composition formula (2) and comprises as a major phase an MgAgAs type crystal structure:

$$(Ln_d(Ti_{a2}Zr_{b2}Hf_{c2})_{1-d})_xNi_ySn_{100-x-y}$$     composition formula (2);

(wherein Ln is at least one element selected from the group consisting of Y and rare earth elements; and a2, b2, c2, d, x and y satisfy the conditions of: $0 \le a2 \le 1$, $0 \le b2 \le 1$, $0 \le c2 \le 1$, $a2+b2+c2=1$, $0 < d \le 0.3$, $30 \le x \le 35$ and $30 \le y \le 35$).

According to a further aspect of the present invention, there is provided a thermoelectric material which is represented by the following composition formula (3) and comprises as a major phase an MgAgAs type crystal structure:

$$Ln1_xNi_ySb_{100-X-Y}$$     composition formula (3);

(wherein Ln1 is at least one element selected from the group consisting of Sc, Y, Gd, Tb, Dy, Ho, Er, Tm, Yb, Lu, Th and U; and X and Y satisfy the conditions of: $30 \le X \le 35$ and $30 \le Y \le 35$, respectively).

According to a further aspect of the present invention, there is provided a thermoelectric material which is represented by the following composition formula (4) and comprises as a major phase an MgAgAs type crystal structure:

$$(Ln2_PY_{1-P})_xNi_YSb_{100-X-Y}$$     composition formula (4);

(wherein Ln2 is at least one element selected from the group consisting of Sc, Gd, Tb, Dy, Ho, Er, Tm, Yb, Lu, Th and U; and p, X and Y satisfy the conditions of: $0.001 \le P \le 0.999$, $30 \le X \le 35$ and $30 \le Y \le 35$, respectively).

According to a further aspect of the present invention, there is provided a thermoelectric element comprising: p-type thermoelectric material and n-type thermoelectric material, both of which are alternately connected with each other in series, wherein the n-type thermoelectric material comprises the thermoelectric material which is represented by the following composition formula (1) and comprises as a major phase an MgAgAs type crystal structure:

$$(Ti_{a1}Zr_{b1}Hf_{c1})_xNi_ySn_{100-x-y}$$     composition formula (1);

(wherein a1, b1, c1, x and y satisfy the conditions of: $0 < a1 < 1$, $0 < b1 < 1$, $0 < c1 < 1$, $a1+b1+c1=1$, $30 \le x \le 35$ and $30 \le y \le 35$).

According to a further aspect of the present invention, there is provided a thermoelectric element comprising: p-type thermoelectric material and n-type thermoelectric material, both of which are alternately connected with each other in series, wherein the n-type thermoelectric material comprises the thermoelectric material which is represented by the following composition formula (2) and comprises as a major phase an MgAgAs type crystal structure:

$$(Ln_d(Ti_{a2}Zr_{b2}Hf_{c2})_{1-d})_xNi_ySn_{100-x-y}$$     composition formula (2);

(wherein Ln is at least one element selected from the group consisting of Y and rare earth elements; and a2, b2, c2, d, x and y satisfy the conditions of: $0 \le a2 \le 1$, $0 \le b2 \le 1$, $0 \le c2 \le 1$, $a2+b2+c2=1$, $0 < d \le 0.3$, $30 \le x \le 35$ and $30 \le y \le 35$).

According to a further aspect of the present invention, there is provided a thermoelectric element comprising: p-type thermoelectric material and n-type thermoelectric material, both of which are alternately connected with each other in series, wherein the p-type thermoelectric material comprises the thermoelectric material which is represented by the following composition formula (3) and comprises as a major phase an MgAgAs type crystal structure:

$$Ln1_xNi_YSb_{100-X-Y}$$     composition formula (3);

(wherein Ln1 is at least one element selected from the group consisting of Sc, Y, Gd, Tb, Dy, Ho, Er, Tm, Yb, Lu, Th and U; and X and Y satisfy the conditions of: $30 \le X \le 35$ and $30 \le Y \le 35$, respectively).

According to a further aspect of the present invention, there is provided a thermoelectric element comprising: p-type thermoelectric material and n-type thermoelectric material, both of which are alternately connected with each other in series, wherein the p-type thermoelectric material comprises the thermoelectric material which is represented by the following composition formula (4) and comprises as a major phase an MgAgAs type crystal structure:

$$(Ln2_PY_{1-P})_xNi_YSb_{100-X-Y}$$     composition formula (4);

(wherein Ln2 is at least one element selected from the group consisting of Sc, Gd, Tb, Dy, Ho, Er, Tm, Yb, Lu, Th and U; and p, X and Y satisfy the conditions of: $0.001 \le P \le 0.999$, $30 \le X \le 35$ and $30 \le Y \le 35$, respectively).

BRIEF DESCRIPTION OF THE SEVERAL VIEWS OF THE DRAWING

FIG. 1 is a model schematically illustrating the structure of half Heusler compound ABX;

FIG. 2 is a diagram illustrating the thermoelectric element according to one embodiment of the present invention;

FIG. 3 is a diagram illustrating the thermoelectric element according to another embodiment of the present invention;

DETAILED DESCRIPTION OF THE INVENTION

Figure 4:
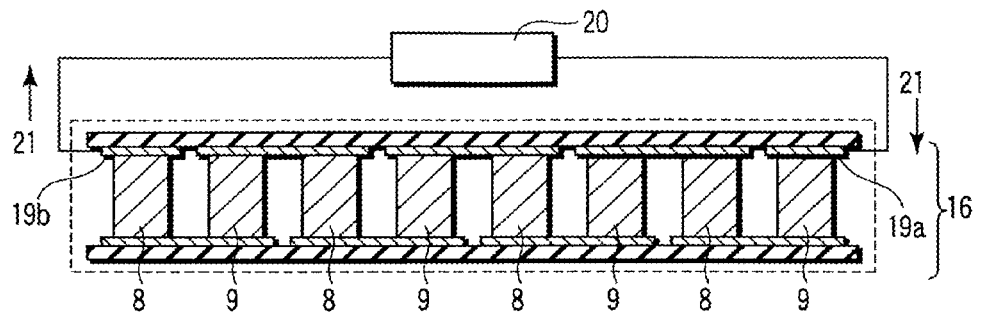
FIG. 4 is a diagram illustrating the thermoelectric element according to a further embodiment of the present invention.

Next, the embodiments of the present invention will be explained in detail.

First Embodiment

Generally, the conductance of heat is effected through two ways, i.e. one through phonon or through the propagation of the vibration of crystal lattice, the other through conductive carrier or through the transfer of free electron. Therefore, the thermal conductivity κ can be represented by the following formula (2):

$$\kappa = \kappa_{ph} + \kappa_{el}$$     formula (2)

wherein $\kappa_{ph}$ is lattice thermal conductivity; and $\kappa_{el}$ is electrical thermal conductivity.

The electrical thermal conductivity $\kappa_{el}$ can be represented by the following formula (3) according to the Wiedemann-Franz law.

$$\kappa_{el} = LT\sigma$$     formula (3)

wherein σ is electrical conductivity; T is absolute temperature; and L is Lorentz factor, which can be represented by the following formula (4).

$$L = (\pi^2/3)(k_B/e)^2$$     formula (4)

wherein $k_B$ is Boltzmann constant ($1.38 \times 10^{-23}$ J/K); and e is the magnitude of electric charge of electron ($-1.60 \times 10^{-19}$ C).

Accordingly, the Lorentz factor becomes a constant, the value of which can be expressed by $2.44 \times 10^{-8} V^2/K^2$. As shown by the aforementioned formula (3), the electrical thermal conductivity $\kappa_{el}$ is proportional to the absolute temperature as well as to the electrical conductivity, so that it is required, in order to minimize the electrical thermal conductivity under the same temperature condition, to minimize the electrical conductivity.

However, as clearly seen from the aforementioned formula (1), it is required to increase the electrical conductivity if the dimensionless figure-of-merit ZT is desired to be increased. Therefore, it is impossible to increase the dimensionless figure-of-merit through the reduction of the entire thermal conductivity $\kappa$ by minimizing the electrical thermal conductivity. Further, as clearly seen from the aforementioned formula (3), assuming that the electrical conductivity is constant irrespective of temperature changes without depending on temperature, electrical thermal conductivity will be increased in proportion to the rise in temperature. Therefore, even if the electrical conductivity is constant, independent of temperature, it is clear from the aforementioned formula (2) that the total thermal conductivity $\kappa$ becomes higher as the temperature increases, thereby minimizing the dimensionless figure-of-merit.

It is clear from the above explanation that if the dimensionless figure-of-merit ZT is to be increased through the reduction of the total thermal conductivity $\kappa$, it is important to consider how to minimize the lattice thermal conductivity $\kappa_{ph}$. This lattice thermal conductivity depends greatly on the kind of crystal lattice and on the kind of element constituting the crystal, and can be lowered by disturbing the regularity of the crystal lattice. In the case of MNiSn having the half Heusler structure, when this M is constituted by any one of Ti, Zr and Hf, the lattice thermal conductivity thereof would be within the range of 6.7 to 9.3 W/mK.

As a result of intensive research conducted by the present inventors, it has been found out that in the case of MNiSn having the half Heusler structure shown in FIG. 1, it is possible to further decrease the thermal conductivity thereof through the introduction of the atomic radius irregularity into the atom of "A site". Incidentally, the reference numbers 1, 2 and 3 in FIG. 1 represent A element (M), B element (Ni) and X element (Sn), respectively, and the reference number 4 represents vacancy.

More specifically, by enabling the atoms located at the "A site" to contain all of Ti, Zr and Hf, scattering of phonons due to non-uniformities of atomic radius and atomic amount is cause to generate, and non-uniformity in size of the crystal lattice is caused to generate, thereby making it possible to considerably decrease the thermal conductivity of the thermoelectric material.

Further, the present inventors found that by enabling the atoms located at the "A site" to contain all of Ti, Zr and Hf, a change of electron density distribution near the Fermi surface becomes sharp, and the Seebeck coefficient increases.

Namely, the n-type thermoelectric material according to one embodiment of the present invention is featured in that it is represented by the following composition formula (1) and that it comprises as a major phase an MgAgAs type crystal structure:

composition formula (1)

Since the atoms located at the "A site" are designed to contain all of Ti, Zr and Hf, the values of all of a1, b1 and c1 are required to be larger than zero. Therefore the values of a1, b1 and c1 are within the ranges of: $0<a1<1$, $0<b1<1$, $0<c1<1$, and $a1+b1+c1=1$. More preferably, the values of a1, b1 and c1 are within the ranges of: $0.1<a1<0.9$, $0.1<b1<0.9$, $0.1<c1<0.9$, and $a1+b1+c1=1$.

Further, in order to realize a high level of Seebeck coefficient through the enhancement of volume fraction to be occupied by a phase having the MgAgAs type crystal structure, the values of x and y should preferably be within the ranges of: $30 \leq x \leq 35$ and $30 \leq y \leq 35$), respectively. A more preferable range of x and y is $33 \leq x \leq 34$ and $33 \leq y \leq 34$), respectively.

The present inventors have also paid attention to rare earth elements each having a larger atomic radius than Ti, Zr or Hf. Further, since rare earth elements are liable to form an alloy phase together with Ni or Sn, the reduction of thermal conductivity due to the formation of this alloy phase can be expected. As a result of intensive research based on such knowledge, the present inventors have found out that it is also possible to greatly improve the thermal conductivity of the thermoelectric material by substituting at least one kind of element selected from the group consisting of Y and rare earth elements for part of M in the half Heusler compound MNiSn (M=Ti, Zr and Hf).

Namely, the n-type thermoelectric material according to another embodiment of the present invention is featured in that it is represented by the following composition formula (2) and that it comprises as a major phase an MgAgAs type crystal structure:

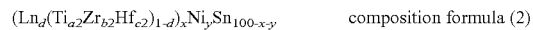
composition formula (2)

Ln is at least one element selected from the group consisting of Y and rare earth elements which include all of the elements having any one of atomic numbers 57 (La) through 71 (Lu) in the periodic table. Among them, it is more preferable to employ, as the Ln, an element selected from Er, Gd and Nd in view of the melting point and atomic radius thereof.

As mentioned above, Ln is effective in minimizing the thermal conductivity of thermoelectric material. Even if the quantity of Ln is small, the effect thereof to minimize the thermal conductivity can be recognized. However, in order to sufficiently minimize the thermal conductivity, the content of this Ln should preferably be 0.1 atomic percent or more based on the total of Ln and (Ti, Zr and Hf). If the content of this Ln exceeds 30 atomic percent based on the total of Ln and (Ti, Zr and Hf) however, phases other than the phase having the aforementioned MgAgAs type crystal structure such as, for example, an $LnSn_3$, phase may be prominently precipitated, thereby possibly deteriorating the Seebeck coefficient. Therefore, the value of d should preferably be within the range of: $0<d \leq 0.3$, more preferably $0.001 \leq d \leq 0.3$.

All of Ti, Zr and Hf in the formula (2) may not necessarily exist concurrently. Therefore, the values of a2, b2 and c2 are within the ranges of: $0 \leq a2 \leq 1$, $0 \leq b2 \leq 1$, $0 \leq c2 \leq 1$, and $a2+b2+c2=1$.

Further, in order to realize a high level of Seebeck coefficient through the enhancement of volume fraction to be occupied by a phase having the MgAgAs type crystal structure, the values of x and y should preferably be within the ranges of: $30 \leq x \leq 35$ and $30 \leq y \leq 35$), respectively. In the case of the half Heusler compound, a high value of Seebeck coefficient can be observed when the total number of valence electrons becomes close to 18. For example, the outer-shell electron configuration in ZrNiSn is: $Zr(5d^2 6s^2)$; $Ni(3d^8 4s^2)$; and $Sn(5s^2 5p^2)$, indicating a total number of valence electrons as 18. Likewise, in the case of TiNiSn and HfNiSn also, the total number of valence electrons become 18.

Whereas, when part of Ti, Zr and Hf is replaced by any of the aforementioned rare earth elements as represented by the aforementioned formula (2), the total number of valence electrons may fall outside this number of 18 due to high possibility that the rare earth elements other than Ce, Eu and Yb may become trivalent, due to the outer-shell electron configuration of ($5d^1 6s^2$). Therefore, the values of x and y may be suitably adjusted so as to compensate such a situation.

It is also possible, in the aforementioned formulas (1) and (2), to replace part of Ti, Zr and Hf with at least one element selected from the group consisting of V, Nb, Ta, Cr, Mo and W. Furthermore, these elements may be employed singly or in combination of two or more for the replacement of part of Ti, Zr and Hf with these elements. It is possible, through this replacement, to adjust the total number of valence electrons in the MgAgAs phase constituting a major phase of the thermoelectric material, thereby making it possible to increase the Seebeck coefficient and the electrical conductivity. As described above, in the case of the half Heusler compound, since a high value of Seebeck coefficient can be observed on an occasion where the total number of valence electrons becomes close to 18, it would be useful to adjust the total number of valence electrons through the employment of these substituting elements together with rare earth elements. However, the substitution ratio of these substituting elements should preferably be 30 atomic percent or less based on the total quantity of Ti, Zr and Hf. If this substitution ratio exceeds 30 atomic percent, phases other than the phase having the aforementioned MgAgAs type crystal structure may be prominently precipitated, thereby possibly deteriorating the Seebeck coefficient.

It is also possible, in the aforementioned formulas (1) and (2), to replace part of Ni with at least one element selected from the group consisting of Mn, Fe, Co and Cu. Furthermore, these elements may be employed singly or in combination of two or more for the replacement of part of Ni with these elements. It is possible, through this replacement, to adjust the total number of valence electrons in the MgAgAs phase constituting a major phase of the thermoelectric material, thereby making it possible to increase the Seebeck coefficient and the electrical conductivity. As for the substitution ratio of these substituting elements, it should preferably be 50 atomic percent or less based on Ni. In particular, the substituting element is constituted by Cu, an excessive substitution of Cu would obstruct the generation of the MgAgAs phase, and hence the substitution of Cu for Ni should preferably be 30 atomic percent or less based on Ni.

It is also possible, in the aforementioned formulas (1) and (2), to replace part of Sn with at least one element selected from the group consisting of As, Sb, Bi, Ge, Pb, Ga and In. Furthermore, these elements may be employed singly or in combination of two or more for the replacement of part of Sn with these elements. It is possible, through this replacement, to adjust the total number of valence electrons in the MgAgAs phase constituting a major phase of the thermoelectric material, thereby making it possible to increase the Seebeck coefficient and the electrical conductivity. However, from the standpoints of obnoxiousness, toxicity and material cost, the elements for substituting Sn should most preferably be selected from Sb and Bi. The substitution ratio of these substituting elements should preferably be 30 atomic percent or less based on Sn. If this substitution ratio exceeds 30 atomic percent, phases other than the phase having the aforementioned MgAgAs type crystal structure may be prominently precipitated, thereby possibly deteriorating the Seebeck coefficient.

Although the foregoing explanation has been given mainly on n-type thermoelectric materials, the theory discussed above is also applicable to p-type thermoelectric materials. It has been revealed by the present inventors that, as compared with the case where Pd is employed for the B element, the employment of Ni in place of Pd is more effective in increasing the power factor of the thermoelectric material.

The p-type thermoelectric material according to one embodiment of the present invention is featured in that it is represented by the following composition formula (3) and that it comprises as a major phase an MgAgAs type crystal structure:

composition formula (3)

When this thermoelectric material is explained with reference to the crystal structure shown in FIG. 1, the A element 1 corresponds to Ln1, the B element 2 corresponds to Ni, and the X element 3 corresponds to Sb.

In this formula (3), Ln1 is at least one element selected from the group consisting of Sc, Y, Gd, Tb, Dy, Ho, Er, Tm, Yb, Lu, Th and U. Further, in order to realize a high level of Seebeck coefficient through the enhancement of volume fraction to be occupied by a phase having the MgAgAs type crystal structure, the values of x and y should preferably be within the range of: 30≤X≤35 and 30≤Y≤35, respectively. A more preferable range of each of X and Y is 33≤X≤34 and 33≤Y≤34, respectively.

In order to greatly minimize the thermal conductivity of thermoelectric material through the generation of non-uniformity in size of the crystal lattice, Y should preferably be incorporated as part of Ln1.

The p-type thermoelectric material according to another embodiment of the present invention is featured in that it is represented by the following composition formula (4) and that it comprises as a major phase an MgAgAs type crystal structure:

composition formula (4)

When this thermoelectric material is explained with reference to the crystal structure shown in FIG. 1, the A element 1 corresponds to Ln2 and Y, the B element 2 corresponds to Ni, and the X element 3 corresponds to Sb.

In this formula (4), Ln2 is at least one element selected from the group consisting of Sc, Gd, Tb, Dy, Ho, Er, Tm, Yb, Lu, Th and U. Further, in order to realize a high level of Seebeck coefficient through the enhancement of volume fraction to be occupied by a phase having the MgAgAs type crystal structure, the values of P, X and Y should preferably be within the range of: 0.001≤P≤0.999, 30≤X≤35 and 30≤Y≤35, respectively. A more preferable range of each of P, X and Y is 0.01≤P≤0.99, 33≤X≤34 and 33≤Y≤34, respectively.

In the p-type thermoelectric material represented by the aforementioned formula (4), the presence of Y is made essential, which is effective in lowering the thermal conductivity thereof. As a result, the performance index thereof can be further enhanced.

It is also possible, in the aforementioned formulas (3) and (4), to replace part of Ln1 or Ln2 with at least one element selected from the group consisting of Ti, Zr, Hf, La, Ce, Pr, Nd, Sm, Eu, Be, Mg, Ca, Sr and Ba. Furthermore, these elements may be employed singly or in combination of two or more for the replacement of part of Ln1 or Ln2 with these elements. It is possible, through this replacement, to adjust the total number of valence electrons in the MgAgAs phase constituting a major phase of the thermoelectric material, thereby making it possible to increase the electrical conductivity. In particular, since the substitution by using bivalent elements such as Be, Mg, Ca, Sr and Ba will be resulted in the substitution of bivalent elements for trivalent Ln1 or Ln2, it is possible to create an electric hole.

Further, since the thermoelectric materials according to this embodiment is p-type, it would be effective in increasing the concentration of carrier and to enhance the electrical conductivity. However, the substitution ratio of these substituting elements should preferably be 30 atomic percent or less based on the total quantity of Ln1 or Ln2. If this substitution ratio exceeds 30 atomic percent, phases other than the phase having the aforementioned MgAgAs type crystal structure may be prominently precipitated, thereby possibly deteriorating the Seebeck coefficient.

It is also possible, in the aforementioned formulas (3) and (4), to replace part of Ni with at least one element selected from the group consisting of V, Nb, Ta, Cr, Mo, W, Mn, Fe, Co, Rh, Ir, Pb, Pt, Cu, Ag, Au and Zn. Furthermore, these elements may be employed singly or in combination of two or more for the replacement of part of Ni with these elements. It is possible, through this replacement, to adjust the total number of valence electrons in the MgAgAs phase constituting a major phase of the thermoelectric material, thereby making it possible to increase the Seebeck coefficient and the electrical conductivity. In particular, since the substitution by the employment of elements (Co, Rh and Ir) having a smaller number of outer-shell valence electrons than that of Ni by one valence electron causes the creation of an electric hole, it would be effective in increasing the concentration of carrier and enhancing the electrical conductivity.

However, the substitution ratio of these substituting elements should preferably be 30 atomic percent or less based on Ni. If this substitution ratio exceeds 30 atomic percent, phases other than the phase having the aforementioned MgAgAs type crystal structure may be prominently precipitated, thereby possibly deteriorating the Seebeck coefficient.

Further, it is also possible, in the aforementioned formulas (3) and (4), to replace part of Sb with at least one element selected from the group consisting of Al, Si, Ga, Ge, As, In, Sn, Pb and Bi. Furthermore, these elements may be employed singly or in combination of two or more for the replacement of part of Sb with these elements. It is possible, through this replacement, to adjust the total number of valence electrons in the MgAgAs phase constituting a major phase of the thermoelectric material, thereby making it possible to increase the Seebeck coefficient and the electrical conductivity. In particular, since the substitution by the employment of elements (Si, Ge, Sn and Pb) having a smaller number of outer-shell valence electrons than that of Sb by one valence electron causes the creation of an electric hole, it would be effective in increasing the concentration of carriers and enhancing the electrical conductivity.

However, the substitution ratio of these substituting elements should preferably be 30 atomic percent or less based on Sb. If this substitution ratio exceeds 30 atomic percents, phases other than the phase having the aforementioned MgAgAs type crystal structure may be prominently precipitated, thereby possibly deteriorating the Seebeck coefficient. Further, since the substitution with Bi for Sb means a substitution with an element having a larger atomic radius and a larger atomic weight, phonon-scattering effects would be enhanced, which is effective in decreasing the lattice thermal conductivity of thermoelectric material.

The thermoelectric material according to the embodiments of the present invention can be manufactured by the following methods.

First of all, an alloy containing predetermined elements each in a prescribed quantity is manufactured by arc melting or high-frequency melting. On the occasion of manufacturing the alloy, it is possible to employ a single-roll method, a double-roll method, a rotating disc method, a liquid quenching method such as a gas atomizing method, or a method utilizing a solid-phase reaction such as a mechanical alloying method. Among them, the liquid quenching method and the mechanical alloying method are advantageous in the respect that it is possible to enlarge the solid solution zones of elements inside the crystal phase and hence to refine the crystal phase constituting the alloy. As a result, it is possible to greatly lower the thermal conductivity of the thermoelectric material.

Alternatively, without subjecting raw metal powder to the aforementioned melting process, the raw metal powder may be subjected to hot press to manufacture an alloy.

The alloy manufactured in this manner may be further subjected to a heat treatment as required. It is possible, through this heat treatment, to turn the alloy into a single-phase and to control the crystalline particle diameter, thereby further enhancing the thermoelectric characteristics. The steps including the aforementioned melting step, liquid quenching step, mechanical alloying step and heat treatment should preferably be performed in an inert atmosphere such as Ar atmosphere in view of preventing the oxidation of the alloy.

Then, the alloy thus obtained is pulverized by using a ball mill, a Braun mill or a stamp mill to obtain alloy powder, which is then subjected to monolithic molding by sintering, hot press or SPS method. This monolithic molding should preferably be performed in an inert atmosphere such as Ar atmosphere in view of preventing the oxidation of the alloy. Subsequently, a molded body thus obtained is worked into a body of desired dimensions, thereby obtaining a thermoelectric material according to the embodiments of the present invention. The specific configuration and dimension of the molded body may be optionally selected. For example, the thermoelectric material may be formed into a cylindrical body having an outer diameter ranging from 0.5 to 10 mm and a thickness ranging from 1 to 30 mm, or into a rectangular parallelepiped having a dimension of: (0.5-10 mm)×(0.5-10 mm)×(1-30 mm thick).

By using the thermoelectric materials obtained in the aforementioned manner, the thermoelectric elements according to the embodiments of the present invention will be manufactured. One example of the construction of such thermoelectric elements is illustrated in FIG. 2.

In the case of the thermoelectric element shown in FIG. 2, a thermoelectric material portion 9 formed of an n-type semiconductor according to the embodiments of the present invention and a thermoelectric material portion 8 formed of a p-type semiconductor according to the embodiments of the present invention are juxtaposed with each other. On the top surface of the n-type thermoelectric material portion 9, an electrode 10a is disposed. Likewise, on the top surface of the p-type thermoelectric material portion 8, an electrode 10b is disposed. The outer surfaces of these electrodes 10a and 10b are connected with an upper insulating substrate 11a. The undersides of the n-type thermoelectric material portions 9 and the p-type thermoelectric material portion 8 are connected with an electrode 10c which is supported by an underside insulating substrate 11b.

When a difference in temperature is caused to generate between the upper insulating substrate 11a and the underside insulating substrate 11b so as to make the upper side lower in temperature and make the lower side higher in temperature, a hole 14 having a positive electric charge is caused to move toward the lower temperature side (upper side) as far as the interior of the p-type thermoelectric material portion 8 is concerned, thereby making the electrode 10b higher in electric potential than the electrode 10c. On the other hand, as far as the interior of the n-type thermoelectric material portion 9 is concerned, an electron 15 having a negative electric charge is caused to move toward the lower temperature side (upper side), thereby making the electrode 10c higher in electric potential than the electrode 10a.

As a result, a difference in electric potential is caused to generate between the electrode 10a and the electrode 10b. As shown in FIG. 2, when the upper side is made lower in temperature and the lower side is made higher in temperature, the electrode 10b becomes a positive electrode, and the electrode 10a becomes a negative electrode.

As shown in FIG. 3, when a plurality of the p-type thermoelectric material portions 8 and a plurality of the n-type thermoelectric material portions 9 are alternately connected with each other in series, thereby making it possible to obtain a higher voltage as compared with the structure shown in FIG. 2 and hence to secure a larger electric power.

The thermoelectric element 16 described above is applicable to a thermoelement. One example of the structure of the thermoelement is shown in FIG. 4. As shown in FIG. 4, when the upper side of the thermoelectric element 16 is made lower in temperature and the lower side thereof is made higher in temperature, a potential difference is caused to generate at the terminal electrode 19 of the thermoelectric element 16. When the electrode 19a and the electrode 19b are respectively connected with a load 20, electric current 21 is permitted to flow in the direction indicated by the arrow as shown in FIG. 4, thereby enabling the thermoelectric element 16 to function as a thermoelement.

Figure 5:
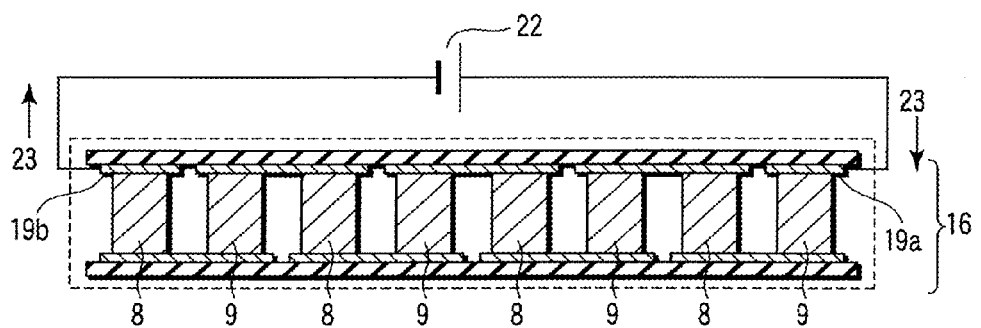
FIG. 5 is a diagram illustrating the thermoelectric element according to a further embodiment of the present invention.

Alternatively, the thermoelectric element 16 described above is applicable to a cooler. One example of the structure of the cooler is shown in FIG. 5. As shown in FIG. 5, when a DC current 23 is permitted flow in the direction indicated by the arrow as shown in FIG. 5 toward the terminal electrode 19 of the thermoelectric element 16 by using a DC power source 22, the upper side of the thermoelectric element 16 is made higher in temperature while the lower side thereof is made lower in temperature, thereby enabling the thermoelectric element to function as a cooler.

The thermoelectric material of the present invention will be further explained in detail in reference to the following specific examples.

Example I

In this Example I, n-type thermoelectric materials are illustrated.

Example I-1

99.9% pure Ti, 99.9% pure Zr, 99.9% pure Hf, 99.99% pure Ni and 99.99% pure Sn were prepared as raw materials, which were then weighed respectively so as to meet a composition formula of:

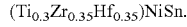

$(Ti_{0.3}Zr_{0.35}Hf_{0.35})NiSn.$

The raw materials weighed as described above were mixed together and placed in a water-cooled copper hearth which was disposed inside an arc furnace. Then, the interior of the hearth was evacuated to a vacuum degree of $2\times10^{-3}$ Pa. Subsequently, high-purity Ar gas 99.999% in purity was introduced into the hearth up to −0.04 MPa to form a reduced-pressure Ar atmosphere, in which the raw materials were subjected to arc-melting. After being melted in this manner, the raw materials were quenched in the water-cooled copper hearth to obtain a metallic lump, which was then hermetically sealed in a quartz tube under a high-vacuum condition of $10^{-4}$ Pa or less and heat-treated for 72 hours at a temperature of 1073K.

The metallic lump thus heat-treated was pulverized and then molded by using a mold having an inner diameter of 20 mm under a pressure of 50 MPa. The molded body thus obtained was placed inside a carbon mold having an inner diameter of 20 mm and was subjected to a pressure sintering for one hour in an Ar atmosphere and under the conditions of: 80 MPa and 1200° C., thereby obtaining a disc-like sintered body having a diameter of 20 mm.

It was confirmed, through the examination of this sintered body by powder X-ray diffractometry, that this sintered body comprises, as a major phase, an MgAgAs type crystal structure.

It was also confirmed, through the analysis of this sintered body by ICP emission spectrometry, that this sintered body was formed of the aforementioned prescribed composition.

The sintered body obtained in this manner was then evaluated with respect to thermoelectric characteristics according to the following methods.
(1) Electrical Resistivity:

The sintered body was cut out into a piece having a dimension of: 2 mm×0.5 mm×18 mm, to which electrodes were attached to measure the electrical resistivity of the piece by a DC four probe method.
(2) Seebeck Coefficient:

The sintered body was cut out into a piece having a dimension of: 4 mm×1 mm×0.5 mm, and a temperature difference of 2° C. was created between the opposite ends of the piece to measure the electromotive force thereof, thus determining the Seebeck coefficient thereof.
(3) Thermal Conductivity:

The sintered body was cut out into a piece having a dimension of: 10 mm (diameter)×2.0 mm (thickness), and the heat diffusivity thereof was measured by laser flash method. In separate from this measurement, the specific heat of the sintered body was determined by DSC measurement, and the density of the sintered body was determined by Archimedes' method, thereby calculating the thermal conductivity of the sintered body on the basis of these measurements.

By using the values obtained of the electrical resistivity, the Seebeck coefficient and the thermal conductivity, the dimensionless figure-of-merit ZT was determined according to the aforementioned formula (1). The values of the electrical resistivity, the Seebeck coefficient, the lattice thermal conductivity and the dimensionless figure-of-merit ZT all obtained at temperatures of 300K and 700K were as follows.
  300K: Electrical resistivity=$8.62\times10^{-3}$ Ω·cm;
  Seebeck coefficient=−333 μV/K;
  Lattice thermal conductivity=3.05 W/mK;
  ZT=0.12
  700K: Electrical resistivity=$2.35\times10^{-3}$ Ω·cm;
  Seebeck coefficient=−328 μV/K;
  Lattice thermal conductivity=1.95 W/mK;
  ZT=1.2

Figure 6:
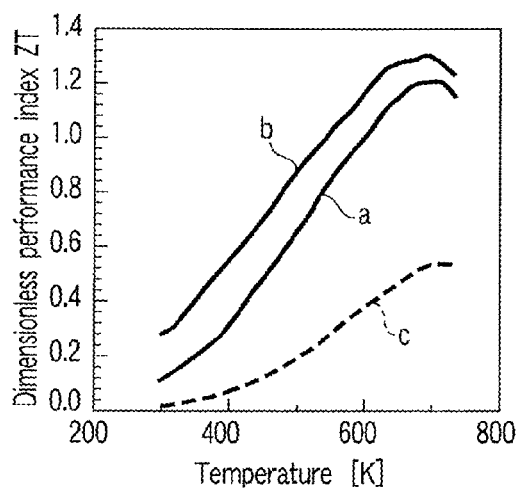
FIG. 6 is a graph illustrating the temperature dependency of the dimensionless figure-of-merit of the thermoelectric material according to one embodiment of the present invention.

The temperature dependency of dimensionless figure-of-merit ZT of the thermoelectric material manufactured in (Example I-1) is shown as a curve "a" in FIG. 6. As shown in FIG. 6, it is possible to obtain a dimensionless figure-of-merit ZT of about 1.21 at maximum.

As already explained, the maximum value of dimensionless figure-of-merit ZT to be obtained from the known thermoelectric material is at most 1.0, which can be obtained from the conventional Bi—Te-based materials. Whereas in this example, it was possible, due to the specific composition of: $(Ti_{0.3}Zr_{0.35}Hf_{0.35})NiSn$, to obtain a thermoelectric material having a high-performance exceeding the conventional maximum value.

Comparative Example I-1

99.9% pure Zr, 99.9% pure Hf, 99.99% pure Ni and 99.99% pure Sn were prepared as raw materials, which were then weighed respectively so as to meet a composition formula of: $Zr_{0.5}Hf_{0.5}NiSn$. By using the raw powder weighed in this manner, a sintered body was manufactured by the same procedures as explained in Example I-1 and the resultant sintered body was evaluated with respect to the thermoelectric characteristics thereof. The values of the electrical resistivity, the Seebeck coefficient, the lattice thermal conductivity and the dimensionless figure-of-merit ZT all obtained at temperatures of 300K and 700K were as follows.

Examples I-2 to I-21; Comparative Examples I-2 to I-3

Thermoelectric materials each varying in composition and represented by a formula of $(Ti_{a_1}Zr_{b_1}Hf_{c_1})NiSn$ were manufactured by the same procedures as explained in the aforementioned Example I-1. Further, each of these thermoelectric materials was evaluated on the characteristics thereof at temperatures of 300K and 700K in the same manner as described above, the results obtained being summarized in the following Table 1. Incidentally, Table 1 also shows the results obtained in the aforementioned (Example I-1) and (Comparative Example I-1).

TABLE 1

|  |  | Content of Ti $a_1$ | Content of Zr $b_1$ | Content of Hf $c_1$ | 300 K Lattice thermal conductivity | 300 K Dimensionless figure-of-merit ZT | 700 K Lattice thermal conductivity | 700 K Dimensionless figure-of-merit ZT |
|---|---|---|---|---|---|---|---|---|
| Examples | I-1 | 0.3 | 0.35 | 0.35 | 3.05 | 0.12 | 1.95 | 1.20 |
|  | I-2 | 0.01 | 0.01 | 0.98 | 3.66 | 0.06 | 2.50 | 1.01 |
|  | I-3 | 0.01 | 0.98 | 0.01 | 3.7 | 0.05 | 2.51 | 1.00 |
|  | I-4 | 0.98 | 0.01 | 0.01 | 3.71 | 0.05 | 2.55 | 1.00 |
|  | I-5 | 0.02 | 0.49 | 0.49 | 3.61 | 0.07 | 2.40 | 1.05 |
|  | I-6 | 0.49 | 0.02 | 0.49 | 3.79 | 0.07 | 2.45 | 1.03 |
|  | I-7 | 0.49 | 0.49 | 0.02 | 3.80 | 0.06 | 2.47 | 1.02 |
|  | I-8 | 0.1 | 0.1 | 0.8 | 3.55 | 0.08 | 2.10 | 1.10 |
|  | I-9 | 0.1 | 0.8 | 0.1 | 3.50 | 0.08 | 2.16 | 1.08 |
|  | I-10 | 0.8 | 0.1 | 0.1 | 3.58 | 0.09 | 2.20 | 1.07 |
|  | I-11 | 0.35 | 0.3 | 0.35 | 2.95 | 0.13 | 1.90 | 1.17 |
|  | I-12 | 0.35 | 0.35 | 0.3 | 3.00 | 0.12 | 1.95 | 1.20 |
|  | I-13 | 0.1 | 0.45 | 0.45 | 3.67 | 0.08 | 2.25 | 1.09 |
|  | I-14 | 0.45 | 0.1 | 0.45 | 3.45 | 0.07 | 2.08 | 1.07 |
|  | I-15 | 0.45 | 0.45 | 0.1 | 3.55 | 0.07 | 2.15 | 1.10 |
|  | I-16 | 0.2 | 0.4 | 0.4 | 3.36 | 0.10 | 2.10 | 1.16 |
|  | I-17 | 0.4 | 0.2 | 0.4 | 3.20 | 0.09 | 1.99 | 1.13 |
|  | I-18 | 0.4 | 0.4 | 0.2 | 3.28 | 0.10 | 2.05 | 1.11 |
|  | I-19 | 0.5 | 0.25 | 0.25 | 3.27 | 0.12 | 2.05 | 1.18 |
|  | I-20 | 0.25 | 0.5 | 0.25 | 3.18 | 0.12 | 2.01 | 1.16 |
|  | I-21 | 0.25 | 0.25 | 0.5 | 3.23 | 0.11 | 2.02 | 1.15 |
| Comparative Examples | I-1 | 0.0 | 0.5 | 0.5 | 3.95 | 0.02 | 3.49 | 0.53 |
|  | I-2 | 0.5 | 0.0 | 0.5 | 4.11 | 0.02 | 3.61 | 0.48 |
|  | I-3 | 0.5 | 0.5 | 0.0 | 4.65 | 0.01 | 4.05 | 0.35 |
|  | I-4 | 1.0 | 0.0 | 0.0 | 9.75 | 0.01 | 6.35 | 0.27 |
|  | I-5 | 0.0 | 1.0 | 0.0 | 8.25 | 0.01 | 5.55 | 0.24 |
|  | I-6 | 0.0 | 0.0 | 1.0 | 7.75 | 0.01 | 5.15 | 0.20 |
|  | I-7 | 0.0 | 0.85 | 0.15 | 5.35 | 0.01 | 4.15 | 0.39 |
|  | I-8 | 0.0 | 0.7 | 0.3 | 4.45 | 0.01 | 3.85 | 0.48 |
|  | I-9 | 0.15 | 0.85 | 0.0 | 5.81 | 0.01 | 4.50 | 0.30 |
|  | I-10 | 0.3 | 0.7 | 0.0 | 4.92 | 0.01 | 4.22 | 0.33 |

300K: Electrical resistivity=$9.6 \times 10^{-3}$ Ωcm;
Seebeck coefficient=−180 μV/K;
Lattice thermal conductivity=3.95 W/mK;
ZT=0.02
700K: Electrical resistivity=$2.3 \times 10^{-3}$ Ωcm;
Seebeck coefficient=−272 μV/K;
Lattice thermal conductivity=3.49 W/mK;
ZT=0.53

The temperature dependency of dimensionless figure-of-merit ZT of the thermoelectric material manufactured in (Comparative Example I-1) is shown as a curve "c" in FIG. 6. It will be seen from FIG. 6 that the dimensionless figure-of-merit ZT of this thermoelectric material was about 0.54 at maximum.

As apparent from this result, it was impossible, due to the composition of: $Zr_{0.5}Hf_{0.5}NiSn$, to obtain a high-performance thermoelectric material which is capable of exceeding that of Bi—Te-based material exhibiting a ZT value of 1.0.

As shown in Table 1, the thermoelectric materials of various compositions each containing three elements (i.e. Ti, Zr and Hf) and represented by the aforementioned formula (1) were all recognized as having excellent thermoelectric conversion characteristics. Whereas, Comparative Examples I-1, I-2 and I-3 all failing to include one of the elements Ti, Zr and Hf were found low in value of the dimensionless figure-of-merit ZT as apparent from the results of Table 1.

Examples I-22 to I-45

Part of Ti, Zr and Hf in the thermoelectric material represented by a formula of $(Ti_{0.3}Zr_{0.35}Hf_{0.35})NiSn$ which was prepared in the aforementioned Example I-1 was replaced with at least one element selected from the group consisting of V, Nb and Ta, thereby manufacturing various thermoelectric materials represented by a formula of $((Ti_{0.3}Zr_{0.35}Hf_{0.35})_{1-e}X_e)NiSn$.

More specifically, these thermoelectric materials were manufactured by the same procedures as explained in the aforementioned Example I-1 except that V, Nb or Ta constituting X was additionally incorporated as a substituting element at a ratio of "e" as shown in the following Table 2. Then, each of these thermoelectric materials was evaluated on the characteristics thereof at temperatures of 300K and 700K in the same manner as described above, the results obtained being summarized in the following Table 2.

TABLE 2

|  |  | Substituting elements X | Content of substituting elements e | 300 K | | 700 K | |
|---|---|---|---|---|---|---|---|
|  |  |  |  | Lattice thermal conductivity | Dimensionless figure-of-merit ZT | Lattice thermal conductivity | Dimensionless figure-of-merit ZT |
| Examples | I-22 | V | 0.003 | 3.21 | 0.24 | 1.93 | 1.19 |
|  | I-23 | V | 0.01 | 3.10 | 0.27 | 1.84 | 1.27 |
|  | I-24 | V | 0.03 | 3.04 | 0.24 | 1.81 | 1.20 |
|  | I-25 | V | 0.10 | 2.95 | 0.22 | 1.77 | 1.08 |
|  | I-26 | Nb | 0.003 | 3.08 | 0.26 | 1.85 | 1.24 |
|  | I-27 | Nb | 0.01 | 3.05 | 0.28 | 1.81 | 1.29 |
|  | I-28 | Nb | 0.03 | 3.01 | 0.27 | 1.77 | 1.22 |
|  | I-29 | Nb | 0.10 | 2.95 | 0.25 | 1.70 | 1.10 |
|  | I-30 | Ta | 0.003 | 3.00 | 0.27 | 1.83 | 1.26 |
|  | I-31 | Ta | 0.01 | 2.94 | 0.28 | 1.79 | 1.30 |
|  | I-32 | Ta | 0.03 | 2.90 | 0.28 | 1.74 | 1.28 |
|  | I-33 | Ta | 0.10 | 2.85 | 0.24 | 1.69 | 1.23 |

Furthermore, part of Ti, Zr and Hf in the thermoelectric material represented by a formula of $(Ti_{0.5}Zr_{0.25}Hf_{0.25})NiSn$ which was replaced with at least one element selected from the group consisting of V, Nb and Ta, thereby manufacturing various thermoelectric materials represented by a formula of $((Ti_{0.5}Zr_{0.25}Hf_{0.25})_{1-e}X_e)NiSn$.

More specifically, these thermoelectric materials were manufactured by the same procedures as explained in the aforementioned Example I-1 except that V, Nb or Ta constituting X was additionally incorporated as a substituting element at a ratio of "e" as shown in the following Table 3. Then, each of these thermoelectric materials was evaluated on the characteristics thereof at temperatures of 300K and 700K in the same manner as described above, the results obtained being summarized in the following Table 3.

TABLE 3

|  |  | Substituting elements X | Content of substituting elements e | 300 K | | 700 K | |
|---|---|---|---|---|---|---|---|
|  |  |  |  | Lattice thermal conductivity | Dimensionless figure-of-merit ZT | Lattice thermal conductivity | Dimensionless figure-of-merit ZT |
| Examples | I-34 | V | 0.003 | 3.35 | 0.21 | 2.08 | 1.17 |
|  | I-35 | V | 0.01 | 3.26 | 0.24 | 2.00 | 1.24 |
|  | I-36 | V | 0.03 | 3.20 | 0.20 | 1.95 | 1.16 |
|  | I-37 | V | 0.10 | 3.06 | 0.18 | 1.90 | 1.06 |
|  | I-38 | Nb | 0.003 | 3.22 | 0.24 | 2.00 | 1.21 |
|  | I-39 | Nb | 0.01 | 3.19 | 0.26 | 1.95 | 1.26 |
|  | I-40 | Nb | 0.03 | 3.14 | 0.24 | 1.90 | 1.18 |
|  | I-41 | Nb | 0.10 | 3.09 | 0.21 | 1.83 | 1.08 |
|  | I-42 | Ta | 0.003 | 3.13 | 0.25 | 1.98 | 1.23 |
|  | I-43 | Ta | 0.01 | 3.07 | 0.27 | 1.93 | 1.28 |
|  | I-44 | Ta | 0.03 | 3.04 | 0.26 | 1.87 | 1.24 |
|  | I-45 | Ta | 0.10 | 2.97 | 0.22 | 1.80 | 1.20 |

As shown in Table 2, the thermoelectric materials of various compositions each represented by the formula $((Ti_{0.3}Zr_{0.35}Hf_{0.35})_{1-e}X_e)NiSn$ (wherein X=V, Nb or Ta) were all recognized as having excellent thermoelectric conversion characteristics. Further, as shown in Table 3, the thermoelectric materials of various compositions each represented by the formula $((Ti_{0.5}Zr_{0.25}Hf_{0.25})_{1-e}X_e)NiSn$ (wherein X=V, Nb or Ta) were also all recognized as having excellent thermoelectric conversion characteristics.

The temperature dependency of dimensionless figure-of-merit ZT of the thermoelectric material manufactured in (Example I-31) is shown as a curve "b" in FIG. 6. The thermoelectric material of (Example I-31) was found higher in the dimensionless figure-of-merit ZT as compared with the thermoelectric material of Example I-1. This may be assumably attributed to the fact that tetravalent Ti, Zr or Hf was replaced by pentavalent Ta, resulting in an increase in concentration of carrier and hence in a decrease in electric resistivity of thermoelectric material.

Furthermore, there were also recognized excellent thermoelectric conversion characteristics in the case of the thermoelectric materials wherein part of Ti, Zr and Hf in the thermoelectric materials manufactured in Example I-2 to I-18 was replaced with at least one kind of element selected from the group consisting of V, Nb and Ta.

Moreover, there were also recognized excellent thermoelectric conversion characteristics in the case of the thermoelectric materials wherein part of Ti, Zr and Hf in the thermoelectric materials manufactured in Example I-2 to I-18 was replaced with at least one element selected from the group consisting of Cr, Mo and W.

Examples I-46 to I-53

Part of Ni in the thermoelectric material represented by a formula of $(Ti_{0.3}Zr_{0.35}Hf_{0.35})NiSn$ which was prepared in the aforementioned Example I-1 was replaced with Cu, thereby manufacturing various thermoelectric materials represented by a formula of $(Ti_{0.3}Zr_{0.35}Hf_{0.35})Ni_{1-f}Cu_fSn$.

More specifically, these thermoelectric materials were manufactured by the same procedures as explained in the aforementioned Example I-1 except that Cu was additionally incorporated as a substituting element at a ratio of "f" as shown in the following Table 4. Then, each of these thermoelectric materials was evaluated on the characteristics thereof at temperatures of 300K and 700K in the same manner as described above, the results obtained being summarized in the following Table 4.

TABLE 4

|  |  | 300 K | | 700 K | |
|---|---|---|---|---|---|
|  | Content of substituting elements f | Lattice thermal conductivity | Dimensionless figure-of-merit ZT | Lattice thermal conductivity | Dimensionless figure-of-merit ZT |
| Examples I-46 | 0.003 | 3.15 | 0.26 | 1.89 | 1.21 |
| I-47 | 0.01 | 3.08 | 0.29 | 1.83 | 1.28 |
| I-48 | 0.03 | 3.01 | 0.26 | 1.79 | 1.22 |
| I-49 | 0.10 | 2.96 | 0.24 | 1.73 | 1.17 |

Further, part of Ni in the thermoelectric material represented by a formula of $(Ti_{0.5}Zr_{0.25}Hf_{0.25})NiSn$ was replaced with Cu, thereby manufacturing various thermoelectric materials represented by a formula of $(Ti_{0.5}Zr_{0.25}Hf_{0.25})Ni_{1-f}Cu_fSn$.

More specifically, these thermoelectric materials were manufactured by the same procedures as explained in the aforementioned Example I-1 except that Cu was additionally incorporated as a substituting element at a ratio of "f" as shown in the following Table 5. Then, each of these thermoelectric materials was evaluated on the characteristics thereof at temperatures of 300K and 700K in the same manner as described above, the results obtained being summarized in the following Table 5.

TABLE 5

|  |  | 300 K | | 700 K | |
|---|---|---|---|---|---|
|  | Content of substituting elements f | Lattice thermal conductivity | Dimensionless figure-of-merit ZT | Lattice thermal conductivity | Dimensionless figure-of-merit ZT |
| Examples I-46 | 0.003 | 3.30 | 0.22 | 1.95 | 1.17 |
| I-47 | 0.01 | 3.21 | 0.26 | 1.90 | 1.25 |
| I-48 | 0.03 | 3.11 | 0.21 | 1.82 | 1.17 |
| I-49 | 0.10 | 3.06 | 0.19 | 1.78 | 1.12 |

As shown in Table 4, the thermoelectric materials of various compositions each represented by the formula $(Ti_{0.3}Zr_{0.35}Hf_{0.35})Ni_{1-f}Cu_fSn$ were all recognized as having excellent thermoelectric conversion characteristics. Further, as shown in Table 5, the thermoelectric materials of various compositions each represented by the formula $(Ti_{0.5}Zr_{0.25}Hf_{0.25})Ni_{1-f}Cu_fSn$ were also all recognized as having excellent thermoelectric conversion characteristics.

Furthermore, there were also recognized excellent thermoelectric conversion characteristics in the case of the thermoelectric materials wherein part of Ni in the thermoelectric materials manufactured in Example I-2 to I-18 was replaced with Cu.

Moreover, there were also recognized excellent thermoelectric conversion characteristics in the case of the thermoelectric materials wherein part of Ni in the thermoelectric materials manufactured in Example I-2 to I-18 was replaced with at least one element selected from the group consisting of Mn, Fe and Co.

Examples I-54 to I-69

Part of Sn in the thermoelectric material represented by a formula of $(Ti_{0.3}Zr_{0.35}Hf_{0.35})NiSn$ which was prepared in the aforementioned Example I-1 was replaced with at least one element selected from the group consisting of Sb and Bi, thereby manufacturing various thermoelectric materials represented by a formula of $(Ti_{0.3}Zr_{0.35}Hf_{0.35})NiSn_{1-g}X_g$.

More specifically, these thermoelectric materials were manufactured by the same procedures as explained in the aforementioned Example I-1 except that Sb or Bi constituting X was additionally incorporated as a substituting element at a ratio of "g" as shown in the following Table 6. Then, each of these thermoelectric materials was evaluated on the characteristics thereof at temperatures of 300K and 700K in the same manner as described above, the results obtained being summarized in the following Table 6.

TABLE 6

|  |  |  | 300 K | | 700 K | |
|---|---|---|---|---|---|---|
|  | Substituting elements X | Content of substituting elements g | Lattice thermal conductivity | Dimensionless figure-of-merit ZT | Lattice thermal conductivity | Dimensionless figure-of-merit ZT |
| Examples I-54 | Sb | 0.003 | 3.07 | 0.29 | 1.95 | 1.07 |
| I-55 | Sb | 0.01 | 3.01 | 0.32 | 1.89 | 1.19 |
| I-56 | Sb | 0.03 | 2.95 | 0.28 | 1.83 | 1.14 |
| I-57 | Sb | 0.10 | 2.91 | 0.25 | 1.77 | 1.08 |
| I-58 | Bi | 0.003 | 2.97 | 0.29 | 1.81 | 1.04 |
| I-59 | Bi | 0.01 | 2.90 | 0.33 | 1.72 | 1.15 |
| I-60 | Bi | 0.03 | 2.83 | 0.29 | 1.67 | 1.11 |
| I-61 | Bi | 0.10 | 2.77 | 0.26 | 1.61 | 1.04 |

Further, part of Sn in the thermoelectric material represented by a formula of $(Ti_{0.5}Zr_{0.25}Hf_{0.25})NiSn$ was replaced with at least one element selected from the group consisting of Sb and Bi, thereby manufacturing various thermoelectric materials represented by a formula of $(Ti_{0.5}Zr_{0.25}Hf_{0.25})NiSn_{1-g}X_g$.

More specifically, these thermoelectric materials were manufactured by the same procedures as explained in the aforementioned Example I-1 except that Sb or Bi constituting X was additionally incorporated as a substituting element at a ratio of "g" as shown in the following Table 7. Then, each of these thermoelectric materials was evaluated on the characteristics thereof at temperatures of 300K and 700K in the same manner as described above, the results obtained being summarized in the following Table 7.

TABLE 7

| | | Substituting elements X | Content of substituting elements g | 300 K Lattice thermal conductivity | 300 K Dimensionless figure-of-merit ZT | 700 K Lattice thermal conductivity | 700 K Dimensionless figure-of-merit ZT |
|---|---|---|---|---|---|---|---|
| Examples | I-62 | Sb | 0.003 | 3.27 | 0.26 | 2.05 | 1.20 |
| | I-63 | Sb | 0.01 | 3.21 | 0.28 | 1.98 | 1.22 |
| | I-64 | Sb | 0.03 | 3.14 | 0.27 | 1.94 | 1.16 |
| | I-65 | Sb | 0.10 | 3.10 | 0.23 | 1.86 | 1.12 |
| | I-66 | Bi | 0.003 | 3.16 | 0.26 | 1.90 | 1.15 |
| | I-67 | Bi | 0.01 | 3.10 | 0.29 | 1.83 | 1.19 |
| | I-68 | Bi | 0.03 | 3.04 | 0.28 | 1.77 | 1.13 |
| | I-69 | Bi | 0.10 | 2.96 | 0.26 | 1.70 | 1.08 |

As shown in Table 6, the thermoelectric materials of various compositions each represented by the formula $(Ti_{0.3}Zr_{0.35}Hf_{0.35})NiSn_{1-g}X_g$ (X=Sb or Bi) were all recognized as having excellent thermoelectric conversion characteristics. Further, as shown in Table 7, the thermoelectric materials of various compositions each represented by the formula $(Ti_{0.5}Zr_{0.25}Hf_{0.25})NiSn_{1-g}X_g$ (X=Sb or Bi) were also all recognized as having excellent thermoelectric conversion characteristics.

Furthermore, there were also recognized excellent thermoelectric conversion characteristics in the case of the thermoelectric materials wherein part of Sn in the thermoelectric materials manufactured in Example I-2 to I-18 was replaced with at least one element selected from the group consisting of Sb and Bi.

Moreover, there were also recognized excellent thermoelectric conversion characteristics in the case of the thermoelectric materials wherein part of Sn in the thermoelectric materials manufactured in Example I-2 to I-18 was replaced with at least one element selected from the group consisting of As, Ge, Pb, Ga and In.

Examples I-70 to I-93

Thermoelectric materials represented by a formula of $(Ln_d(Ti_{a2}Zr_{b2}Hf_{c2})_{1-d})_xNi_ySn_{100-x-y}$ (wherein Ln is at least one element selected from the group consisting of Er, Gd and Nd; and a2, b2, c2, d, x and y satisfy the conditions of: $0 \le a2 \le 1$, $0 \le b2 \le 1$, $0 \le c2 \le 1$, $a2+b2+c2=1$, $0<d \le 0.3$, $30 \le x \le 35$ and $30 \le y \le 35$) were manufactured by the same procedures as explained in the aforementioned Example I-1. Further, each of these thermoelectric materials was evaluated on the characteristics thereof at temperatures of 300K and 700K in the same manner as described above, the results obtained being summarized in the following Table 8.

TABLE 8

| | | Elements of Ln | Content of Ln d | Content of Ti $a_2$ | Content of Zr $b_2$ | Content of Hf $c_2$ | x | y | 300 K $\kappa_{ph}$ | 300 K ZT | 700 K $\kappa_{ph}$ | 700 K ZT |
|---|---|---|---|---|---|---|---|---|---|---|---|---|
| Examples | I-70 | Er | 0.001 | 0.0 | 0.5 | 0.5 | 33.3 | 33.3 | 3.70 | 0.06 | 2.44 | 1.02 |
| | I-71 | Er | 0.01 | 0.0 | 0.5 | 0.5 | 33.3 | 33.4 | 3.60 | 0.08 | 2.37 | 1.07 |
| | I-72 | Er | 0.1 | 0.0 | 0.5 | 0.5 | 32.8 | 33.9 | 3.41 | 0.09 | 2.25 | 1.10 |
| | I-73 | Er | 0.3 | 0.0 | 0.5 | 0.5 | 31.7 | 34.9 | 3.33 | 0.07 | 2.20 | 1.05 |
| | I-74 | Er | 0.001 | 0.5 | 0.5 | 0.0 | 33.3 | 33.3 | 3.91 | 0.05 | 2.61 | 1.01 |
| | I-75 | Er | 0.01 | 0.5 | 0.5 | 0.0 | 33.3 | 33.4 | 3.79 | 0.07 | 2.50 | 1.05 |
| | I-76 | Er | 0.1 | 0.5 | 0.5 | 0.0 | 32.8 | 33.9 | 3.53 | 0.09 | 2.37 | 1.09 |
| | I-77 | Er | 0.3 | 0.5 | 0.5 | 0.0 | 31.7 | 34.9 | 3.46 | 0.06 | 2.31 | 1.04 |
| | I-78 | Er | 0.001 | 0.5 | 0.0 | 0.5 | 33.3 | 33.3 | 3.94 | 0.05 | 2.62 | 1.00 |
| | I-79 | Er | 0.01 | 0.5 | 0.0 | 0.5 | 33.3 | 33.4 | 3.81 | 0.07 | 2.44 | 1.05 |
| | I-80 | Er | 0.1 | 0.5 | 0.0 | 0.5 | 32.8 | 33.9 | 3.57 | 0.08 | 2.40 | 1.09 |
| | I-81 | Er | 0.3 | 0.5 | 0.0 | 0.5 | 31.7 | 34.9 | 3.51 | 0.06 | 2.33 | 1.03 |
| | I-82 | Er | 0.001 | 0.3 | 0.35 | 0.35 | 33.3 | 33.3 | 2.97 | 0.13 | 1.96 | 1.10 |
| | I-83 | Er | 0.01 | 0.3 | 0.35 | 0.35 | 33.3 | 33.4 | 2.63 | 0.14 | 1.73 | 1.17 |
| | I-84 | Er | 0.1 | 0.3 | 0.35 | 0.35 | 32.8 | 33.9 | 2.30 | 0.16 | 1.52 | 1.22 |
| | I-85 | Er | 0.3 | 0.3 | 0.35 | 0.35 | 31.7 | 34.9 | 2.25 | 0.12 | 1.50 | 1.14 |
| | I-86 | Nd | 0.001 | 0.3 | 0.35 | 0.35 | 33.3 | 33.3 | 3.01 | 0.13 | 1.98 | 1.10 |
| | I-87 | Nd | 0.01 | 0.3 | 0.35 | 0.35 | 33.3 | 33.4 | 2.71 | 0.14 | 1.81 | 1.15 |
| | I-88 | Nd | 0.1 | 0.3 | 0.35 | 0.35 | 32.8 | 33.9 | 2.41 | 0.15 | 1.57 | 1.19 |
| | I-89 | Nd | 0.3 | 0.3 | 0.35 | 0.35 | 31.7 | 34.9 | 2.37 | 0.14 | 1.54 | 1.11 |
| | I-90 | Gd | 0.001 | 0.3 | 0.35 | 0.35 | 33.3 | 33.3 | 2.99 | 0.12 | 1.98 | 1.10 |
| | I-91 | Gd | 0.01 | 0.3 | 0.35 | 0.35 | 33.3 | 33.4 | 2.67 | 0.13 | 1.75 | 1.17 |

TABLE 8-continued

| | Elements of Ln | Content of Ln d | Content of Ti a$_2$ | Content of Zr b$_2$ | Content of Hf c$_2$ | x | y | 300 K κ$_{ph}$ | 300 K ZT | 700 K κ$_{ph}$ | 700 K ZT |
|---|---|---|---|---|---|---|---|---|---|---|---|
| I-92 | Gd | 0.1 | 0.3 | 0.35 | 0.35 | 32.8 | 33.9 | 2.35 | 0.15 | 1.52 | 1.21 |
| I-93 | Gd | 0.3 | 0.3 | 0.35 | 0.35 | 31.7 | 34.9 | 2.30 | 0.12 | 1.49 | 1.13 |

As shown in Table 8, the thermoelectric materials of various compositions represented by the aforementioned formula of $(Ln_d(Ti_{a2}Zr_{b2}Hf_{c2})_{1-d})_xNi_ySn_{100-x-y}$ (wherein Ln is at least one element selected from the group consisting of Er, Gd and Nd; and a2, b2, c2, d, x and y satisfy the conditions of: 0≤a2≤1, 0≤b2≤1, 0≤c2≤1, a2+b2+c2=1, 0<d≤0.3, 30≤x≤35 and 30≤y≤35) were all recognized as having excellent thermoelectric conversion characteristics.

Examples I-94 to I-105

Part of $(Ti_{a2}Zr_{b2}Hf_{c2})$ in the thermoelectric material represented by a formula of $(Ln_d(Ti_{a2}Zr_{b2}Hf_{c2})_{1-d})_xNi_ySn_{100-x-y}$ (wherein Ln is at least one element selected from the group consisting of Er, Gd and Nd; and a2, b2, c2, d, x and y satisfy the conditions of: 0≤a2≤1, 0≤b2≤1, 0≤c2≤1, a2+b2+c2=1, 0<d≤0.3, 30≤x≤35 and 30≤y≤35) was replaced with at least one element selected from the group consisting of V, Nb and Ta, thereby manufacturing various thermoelectric materials represented by a formula of $(Ln_d(Ti_{a2}Zr_{b2}Hf_{c2})_{1-d-e}X_e)_xNi_ySn_{100-x-y}$.

More specifically, these thermoelectric materials were manufactured by the same procedures as explained in the aforementioned Example I-1 except that V, Nb and Ta constituting X was additionally incorporated as a substituting element at a ratio of "e" as shown in the following Table 9. Then, each of these thermoelectric materials was evaluated on the characteristics thereof at temperatures of 300K and 700K in the same manner as described above. The results where Er was included as Ln are summarized in the following Table 9.

b2=0.35, c2=0.35, x=y=33.3) were all recognized as having excellent thermoelectric conversion characteristics due to the inclusion of V, Nb or Ta.

Furthermore, there were also recognized excellent thermoelectric conversion characteristics in the case of the thermoelectric materials wherein Gd or Nd was included as Ln in the aforementioned compositions.

Moreover, there were also recognized excellent thermoelectric conversion characteristics in the case of the thermoelectric materials wherein V, Nb or Ta was included as X in the aforementioned compositions irrespective of the element to be included as Ln.

Examples I-106 to I-109

Part of Ni in the thermoelectric material represented by a formula of $(Ln_d(Ti_{a2}Zr_{b2}Hf_{c2})_{1-d})_xNi_ySn_{100-x-y}$ (wherein Ln is at least one element selected from the group consisting of Er, Gd and Nd; and a2, b2, c2, d, x and y satisfy the conditions of: 0≤a2≤1, 0≤b2≤1, 0≤c2≤1, a2+b2+c2=1, 0<d≤0.3, 30≤x≤35 and 30≤y≤35) was replaced by Cu, thereby manufacturing various thermoelectric materials represented by a formula of $(Ln_d(Ti_{a2}Zr_{b2}Hf_{c2})_{1-d})_x(Ni_{1-f}Cu_f)_ySn_{100-x-y}$.

More specifically, these thermoelectric materials were manufactured by the same procedures as explained in the aforementioned Example I-1 except that Cu was additionally incorporated as a substituting element at a ratio of "f" as shown in the following Table 10. Then, each of these thermoelectric materials was evaluated on the characteristics thereof

TABLE 9

| | | Elements of X | Content of X e | Content of Er d | Content of Ti a$_2$ | Content of Zr b$_2$ | Content of Hf c$_2$ | x | y | 300 K κ$_{ph}$ | 300 K ZT | 700 K κ$_{ph}$ | 700 K ZT |
|---|---|---|---|---|---|---|---|---|---|---|---|---|---|
| Examples | I-94 | V | 0.011 | 0.001 | 0.3 | 0.35 | 0.35 | 33.3 | 33.3 | 2.50 | 0.21 | 1.90 | 1.16 |
| | I-95 | V | 0.02 | 0.01 | 0.3 | 0.35 | 0.35 | 33.3 | 33.3 | 2.37 | 0.24 | 1.75 | 1.21 |
| | I-96 | V | 0.11 | 0.1 | 0.3 | 0.35 | 0.35 | 33.3 | 33.3 | 2.32 | 0.21 | 1.68 | 1.18 |
| | I-97 | V | 0.31 | 0.3 | 0.3 | 0.35 | 0.35 | 33.3 | 33.3 | 2.29 | 0.19 | 1.66 | 1.14 |
| | I-98 | Nb | 0.011 | 0.001 | 0.3 | 0.35 | 0.35 | 33.3 | 33.3 | 2.45 | 0.23 | 1.82 | 1.20 |
| | I-99 | Nb | 0.02 | 0.01 | 0.3 | 0.35 | 0.35 | 33.3 | 33.3 | 2.34 | 0.27 | 1.70 | 1.24 |
| | I-100 | Nb | 0.11 | 0.1 | 0.3 | 0.35 | 0.35 | 33.3 | 33.3 | 2.29 | 0.25 | 1.64 | 1.21 |
| | I-101 | Nb | 0.31 | 0.3 | 0.3 | 0.35 | 0.35 | 33.3 | 33.3 | 2.26 | 0.22 | 1.61 | 1.16 |
| | I-102 | Ta | 0.011 | 0.001 | 0.3 | 0.35 | 0.35 | 33.3 | 33.3 | 2.39 | 0.24 | 1.70 | 1.21 |
| | I-103 | Ta | 0.02 | 0.01 | 0.3 | 0.35 | 0.35 | 33.3 | 33.3 | 2.26 | 0.26 | 1.61 | 1.25 |
| | I-104 | Ta | 0.11 | 0.1 | 0.3 | 0.35 | 0.35 | 33.3 | 33.3 | 2.21 | 0.26 | 1.55 | 1.23 |
| | I-105 | Ta | 0.31 | 0.3 | 0.3 | 0.35 | 0.35 | 33.3 | 33.3 | 2.18 | 0.23 | 1.53 | 1.18 |

As shown in Table 9, the thermoelectric materials of various compositions each represented by the formula $(Ln_d(Ti_{a2}Zr_{b2}Hf_{c2})_{1-d-e}X_e)_xNi_ySn_{100-x-y}$ (wherein Ln=Er, a2=0.3, at temperatures of 300K and 700K in the same manner as described above. The results where Er was included as Ln are summarized in the following Table 10.

TABLE 10

| | | Content of Cu f | Content of Er d | Content of Ti a$_2$ | Content of Zr b$_2$ | Content of Hf c$_2$ | x | y | 300 K κ$_{ph}$ | 300 K ZT | 700 K κ$_{ph}$ | 700 K ZT |
|---|---|---|---|---|---|---|---|---|---|---|---|---|
| Examples | I-106 | 0.011 | 0.001 | 0.3 | 0.35 | 0.35 | 33.3 | 33.3 | 2.47 | 0.21 | 1.88 | 1.18 |
| | I-107 | 0.02 | 0.01 | 0.3 | 0.35 | 0.35 | 33.3 | 33.3 | 2.35 | 0.26 | 1.73 | 1.22 |

TABLE 10-continued

|  | Content of Cu f | Content of Er d | Content of Ti $a_2$ | Content of Zr $b_2$ | Content of Hf $c_2$ | x | y | 300 K $\kappa_{ph}$ | 300 K ZT | 700 K $\kappa_{ph}$ | 700 K ZT |
|---|---|---|---|---|---|---|---|---|---|---|---|
| I-108 | 0.11 | 0.1 | 0.3 | 0.35 | 0.35 | 33.3 | 33.3 | 2.30 | 0.24 | 1.66 | 1.20 |
| I-109 | 0.31 | 0.3 | 0.3 | 0.35 | 0.35 | 33.3 | 33.3 | 2.28 | 0.20 | 1.64 | 1.14 |

As shown in Table 10, the thermoelectric materials of various compositions each represented by the formula $(Ln_d(Ti_{a2}Zr_{b2}Hf_{c2})_{1-d})_x(Ni_{1-f}Cu_f)_y Sn_{100-x-y}$ (wherein Ln=Er, a2=0.3, b2=0.35, c2=0.35, x=y=33.3) were all recognized as having excellent thermoelectric conversion characteristics.

Furthermore, there were also recognized excellent thermoelectric conversion characteristics in the case of the thermoelectric materials wherein Gd or Nd was included as Ln in the aforementioned compositions.

Moreover, there were also recognized excellent thermoelectric conversion characteristics in the case of the thermoelectric materials wherein Mn, Fe or Co was substituted, instead of Cu, for part of Ni irrespective of the element to be included as Ln.

Examples I-110 to I-117

Part of Sn in the thermoelectric material represented by a formula of $(Ln_d(Ti_{a2}Zr_{b2}Hf_{c2})_{1-d})_x Ni_y Sn_{100-x-y}$ (wherein Ln is at least one element selected from the group consisting of Er, Gd and Nd; and a2, b2, c2, d, x and y satisfy the conditions of: $0 \leq a2 \leq 1$, $0 \leq b2 \leq 1$, $0 \leq c2 \leq 1$, $a2+b2+c2=1$, $0 < d \leq 0.3$, $30 \leq x \leq 35$ and $30 \leq y \leq 35$) was replaced with at least one element selected from the group consisting of Sb and Bi, thereby manufacturing various thermoelectric materials represented by a formula of $(Ln_d(Ti_{a2}Zr_{b2}Hf_{c2})_{1-d})_x Ni_y(Sn_{1-g}X_g)_{100-x-y}$.

More specifically, these thermoelectric materials were manufactured by the same procedures as explained in the aforementioned Example I-1 except that Sb and Bi constituting X was additionally incorporated as a substituting element at a ratio of "g" as shown in the following Table 11. Then, each of these thermoelectric materials was evaluated on the characteristics thereof at temperatures of 300K and 700K in the same manner as described above. The results where Er was included as Ln are summarized in the following Table 11.

electric materials wherein Gd or Nd was included as Ln in the aforementioned compositions.

Moreover, there were also recognized excellent thermoelectric conversion characteristics in the case of the thermoelectric materials wherein As, Ge, Pb, Ga or In was included as X in the aforementioned compositions irrespective of the element to be included as Ln.

Example I-118

By using a composition consisting of $CeCoFe_3Sb_{12}$ as a p-type thermoelectric material and the thermoelectric material of Example I-30 as an n-type thermoelectric material, a thermoelectric element as shown in FIG. 3 was manufactured.

Each of these p-type and n-type thermoelectric materials was cut into a body 3.0 mm×3.0 mm square in planar configuration and 10.0 mm in height. 60 pieces of p-type thermoelectric bodies and 60 pieces of n-type thermoelectric bodies were alternately arranged in the form of matrix consisting of 10 columns×12 rows. Then, all of 120 pieces were electrically connected in series with a silver electrode board. To the other surface of the silver electrode board, i.e. the surface opposite to the surface to which the thermoelectric element was connected, there was attached an aluminum nitride sintered plate, and furthermore, lead wires were connected to the terminal electrodes, thereby manufacturing the thermoelectric element.

Then, on this thermoelectric element, the power-generating property thereof was evaluated by setting the temperature of upper temperature side to 570° C. and the temperature of lower temperature side to 55° C. The internal resistance of this thermoelectric conversion module was found 2.22Ω

TABLE 11

|  |  | Elements of X | Content of X g | Content of Er d | Content of Ti $a_2$ | Content of Zr $b_2$ | Content of Hf $c_2$ | x | y | 300 K $\kappa_{ph}$ | 300 K ZT | 700 K $\kappa_{ph}$ | 700 K ZT |
|---|---|---|---|---|---|---|---|---|---|---|---|---|---|
| Examples | I-110 | Sb | 0.011 | 0.001 | 0.3 | 0.35 | 0.35 | 33.3 | 33.3 | 2.45 | 0.24 | 1.83 | 1.11 |
|  | I-111 | Sb | 0.02 | 0.01 | 0.3 | 0.35 | 0.35 | 33.3 | 33.3 | 2.33 | 0.27 | 1.72 | 1.18 |
|  | I-112 | Sb | 0.11 | 0.1 | 0.3 | 0.35 | 0.35 | 33.3 | 33.3 | 2.27 | 0.29 | 1.66 | 1.18 |
|  | I-113 | Sb | 0.31 | 0.3 | 0.3 | 0.35 | 0.35 | 33.3 | 33.3 | 2.25 | 0.24 | 1.64 | 1.16 |
|  | I-114 | Bi | 0.011 | 0.001 | 0.3 | 0.35 | 0.35 | 33.3 | 33.3 | 2.34 | 0.26 | 1.75 | 1.07 |
|  | I-115 | Bi | 0.02 | 0.01 | 0.3 | 0.35 | 0.35 | 33.3 | 33.3 | 2.23 | 0.30 | 1.69 | 1.10 |
|  | I-116 | Bi | 0.11 | 0.1 | 0.3 | 0.35 | 0.35 | 33.3 | 33.3 | 2.28 | 0.27 | 1.64 | 1.10 |
|  | I-117 | Bi | 0.31 | 0.3 | 0.3 | 0.35 | 0.35 | 33.3 | 33.3 | 2.15 | 0.23 | 1.61 | 1.05 |

As shown in Table 11, the thermoelectric materials of various compositions each represented by the formula $(Ln_d(Ti_{a2}Zr_{b2}Hf_{c2})_{1-d})_x Ni_y(Sn_{1-g}X_g)_{100-x-y}$ (wherein Ln=Er, X=Sb or Bi, a2=0.3, b2=0.35, c2=0.35, x=y=33.3) were all recognized as having excellent thermoelectric conversion characteristics.

Furthermore, there were also recognized excellent thermoelectric conversion characteristics in the case of the thermounder these temperature conditions. The power-generating property of this thermoelectric element was measured under a matched load condition where the load connected thereto was set to 2.22Ω which was the same as that of the internal resistance of thermoelectric conversion module. As a result, the voltage generated was 5.0V, and an electric current of 3.24 A was permitted to flow, thereby obtaining an electric power of 16.2 W, thus confirming the generation of electric power.

Example II

In this Example II, p-type thermoelectric materials are illustrated.

Example II-1

99.9% pure Y, 99.9% pure Er, 99.99% pure Ni, and 99.99% pure Sb were prepared as raw materials, which were then weighed respectively so as to meet a composition formula of: $Y_{0.5}Er_{0.5}NiSb$.

The raw materials weighed as described above were mixed together and placed in a water-cooled copper hearth which was disposed inside an arc furnace. Then, the interior of the hearth was evacuated to a vacuum degree of $2 \times 10^{-3}$ Pa. Subsequently, high-purity Ar gas 99.999% in purity was introduced into the hearth up to −0.04 MPa to form a reduced-pressure Ar atmosphere, in which the raw materials were subjected to arc-melting. After being melted in this manner, the raw materials were quenched in the water-cooled copper hearth to obtain a metallic lump, which was then hermetically sealed in a quartz tube under a high-vacuum condition of $10^{-4}$ Pa or less and heat-treated for 72 hours at a temperature of 1073K.

The metallic lump thus heat-treated was pulverized and then molded by using a mold having an inner diameter of 20 mm under a pressure of 50 MPa. The molded body thus obtained was placed inside a carbon mold having an inner diameter of 20 mm and was subjected to a pressure sintering for one hour in an Ar atmosphere and under the conditions of: 80 MPa and 1200° C., thereby obtaining a disc-like sintered body having a diameter of 20 mm.

It was confirmed, through the examination of this sintered body by powder X-ray diffractometry, that this sintered body comprises, as a major phase, an MgAgAs type crystal structure.

It was also confirmed, through the analysis of this sintered body by ICP emission spectrometry, that this sintered body was formed of the aforementioned prescribed composition.

The sintered body obtained in this manner was then evaluated with respect to thermoelectric characteristics according to the following methods.

(1) Electrical Resistivity:

The sintered body was cut out into a piece having a dimension of: 2 mm×0.5 mm×18 mm, to which electrodes were attached to measure the electrical resistivity of the piece by a DC four probe method.

(2) Seebeck Coefficient:

The sintered body was cut out into a piece having a dimension of: 4 mm×1 mm×0.5 mm, and a temperature difference of 2° C. was created between the opposite ends of the piece to measure the electromotive force thereof, thus determining the Seebeck coefficient thereof.

(3) Thermal Conductivity:

The sintered body was cut out into a piece having a dimension of: 10 mm (diameter)×2.0 mm (thickness), and the heat diffusivity thereof was measured by laser flash method. In separate from this measurement, the specific heat of the sintered body was determined by DSC measurement, and the density of the sintered body was determined by Archimedes' method, thereby calculating the thermal conductivity of the sintered body on the basis of these measurements.

By using the values obtained of the electrical resistivity, the Seebeck coefficient and the thermal conductivity, the dimensionless figure-of-merit ZT was determined according to the aforementioned formula (1). The values of the electrical resistivity, the Seebeck coefficient, the lattice thermal conductivity and the dimensionless figure-of-merit ZT all obtained at temperatures of 300K and 700K were as follows.

300K: Electrical resistivity=$47.5 \times 10^{-3}$ Ω·cm;
Seebeck coefficient=351 µV/K;
Lattice thermal conductivity=3.18 W/mK;
ZT=0.02
700K: Electrical resistivity=$2.82 \times 10^{-3}$ Ωcm;
Seebeck coefficient=311 µV/K;
Lattice thermal conductivity=1.79 W/mK;
ZT=1.04

Figure 7:
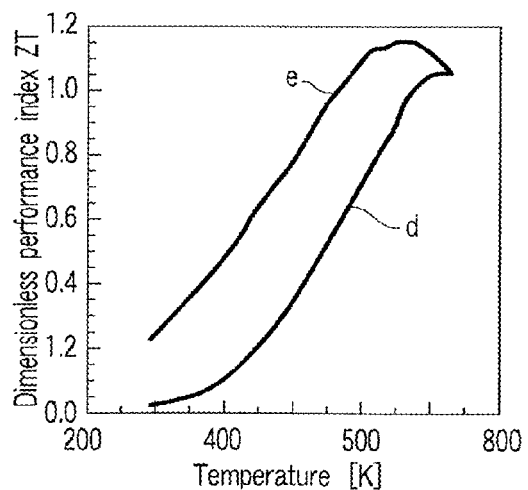
FIG. 7 is a graph illustrating the temperature dependency of the dimensionless figure-of-merit of the thermoelectric material according to another embodiment of the present invention.

The temperature dependency of dimensionless figure-of-merit ZT of the thermoelectric material manufactured in (Example II-1) is shown as a curve "d" in FIG. 7. As shown in FIG. 7, it is possible to obtain a dimensionless figure-of-merit ZT of about 1.05 at maximum.

As already explained, the maximum value of dimensionless figure-of-merit ZT to be obtained from the known thermoelectric material is at most 1.0 which can be obtained from the conventional Bi—Te-based materials. Whereas in this example, it was possible, due to the specific composition of: $Y_{0.5}Er_{0.5}NiSn$, to obtain a thermoelectric material having a high-performance exceeding the conventional maximum value. Namely, since the B element of the half Heusler compound ABX was constituted by Ni in this example, it was possible to increase the power factor.

Comparative Example II-1

99.9% pure Y, 99.9% pure Er, 99.99% pure Pd, and 99.99% pure Sb were prepared as raw materials, which were then weighed respectively so as to meet a composition formula of: $Y_{0.5}Er_{0.5}PdSb$. By using the raw powder weighed in this manner, a sintered body was manufactured by the same procedures as explained in Example II-1 and the resultant sintered body was evaluated with respect to the thermoelectric characteristics thereof. The values of the electrical resistivity, the Seebeck coefficient, the lattice thermal conductivity and the dimensionless figure-of-merit ZT all obtained at temperatures of 300K and 700K were as follows.

300K: Electrical resistivity=$29.0 \times 10^{-3}$ cm;
Seebeck coefficient=155 µV/K;
Lattice thermal conductivity=2.97 W/mK;
ZT=0.00
700K: Electrical resistivity=$2.1 \times 10^{-3}$ Ω·cm;
Seebeck coefficient=190 µV/K;
Lattice thermal conductivity=1.29 W/mK;
ZT=0.57

Since the B element of the half Heusler compound ABX was constituted by Pd in this comparative example, it was impossible to obtain a high-performance thermoelectric material which is capable of exceeding over that of Bi—Te-based material exhibiting a ZT value of 1.0.

Examples II-2 to II-31

Thermoelectric materials each varying in composition and represented by a formula of $(Ln3_sLn4_{1-s})NiSb$ (wherein Ln3 and Ln4 represent respectively an element selected from the group consisting of Y, Gd, Tb, Dy, Ho, Er and Yb, said Ln3 and Ln4 differing from each other) were manufactured by the same procedures as explained in the aforementioned Example II-1. Further, each of these thermoelectric materials was evaluated on the characteristics thereof at temperatures of 300K and 700K in the same manner as described above, the results obtained being summarized in the following Table 12. Incidentally, Table 12 also shows the results obtained in Example II-1.

TABLE 12

| | | Element Ln3 | Element Ln4 | Content of substituting elements S | Dimensionless performance index ZT 300 K | 700 K |
|---|---|---|---|---|---|---|
| Examples | II-2 | Y | Gd | 0.2 | 0.01 | 1.00 |
| | II-3 | Y | Gd | 0.5 | 0.02 | 1.01 |
| | II-4 | Y | Gd | 0.7 | 0.01 | 1.00 |
| | II-5 | Y | Tb | 0.2 | 0.01 | 1.01 |
| | II-6 | Y | Tb | 0.5 | 0.02 | 1.02 |
| | II-7 | Y | Tb | 0.7 | 0.01 | 1.02 |
| | II-8 | Y | Dy | 0.2 | 0.02 | 1.01 |
| | II-9 | Y | Dy | 0.5 | 0.02 | 1.03 |
| | II-10 | Y | Dy | 0.7 | 0.02 | 1.02 |
| | II-11 | Y | Ho | 0.2 | 0.02 | 1.02 |
| | II-12 | Y | Ho | 0.5 | 0.03 | 1.03 |
| | II-13 | Y | Ho | 0.7 | 0.02 | 1.01 |
| | II-14 | Y | Er | 0.2 | 0.02 | 1.02 |
| | II-1 | Y | Er | 0.5 | 0.02 | 1.04 |
| | II-15 | Y | Er | 0.7 | 0.02 | 1.03 |
| | II-16 | Y | Yb | 0.2 | 0.01 | 1.01 |
| | II-17 | Y | Yb | 0.5 | 0.02 | 1.02 |
| | II-18 | Y | Yb | 0.7 | 0.01 | 1.01 |
| | II-19 | Gd | Tb | 0.5 | 0.01 | 1.00 |
| | II-20 | Gd | Dy | 0.5 | 0.01 | 1.00 |
| | II-21 | Gd | Ho | 0.5 | 0.01 | 1.01 |
| | II-22 | Gd | Er | 0.5 | 0.01 | 1.02 |
| | II-23 | Gd | Yb | 0.5 | 0.02 | 1.03 |
| | II-24 | Tb | Dy | 0.5 | 0.01 | 1.01 |
| | II-25 | Tb | Ho | 0.5 | 0.01 | 1.01 |
| | II-26 | Tb | Er | 0.5 | 0.01 | 1.02 |
| | II-27 | Tb | Yb | 0.5 | 0.02 | 1.02 |
| | II-28 | Dy | Ho | 0.5 | 0.01 | 1.02 |
| | II-29 | Dy | Er | 0.5 | 0.01 | 1.02 |
| | II-30 | Dy | Yb | 0.5 | 0.02 | 1.03 |
| | II-31 | Er | Yb | 0.5 | 0.02 | 1.02 |

As shown in Table 12, the thermoelectric materials of various compositions each represented by the aforementioned formula $(Ln3_S Ln4_{1-S})NiSb$ (wherein Ln3 and Ln4 represent respectively an element selected from the group consisting of Y, Gd, Tb, Dy, Ho, Er and Yb) were all recognized as having excellent thermoelectric conversion characteristics.

Examples II-32 to II-51

Part of Y and Er in the thermoelectric material represented by a formula of $Y_{0.5}Er_{0.5}NiSb$ which was prepared in the aforementioned Example II-1 was replaced with at least one element selected from the group consisting of Be, Mg, Ca, Sr and Ba, thereby manufacturing various thermoelectric materials represented by a formula of $(Y_{0.5}Er_{0.5})_{1-a}X_a NiSb$ (wherein X represents an element selected from the group consisting of Be, Mg, Ca, Sr and Ba).

Then, each of these thermoelectric materials was evaluated on the characteristics thereof at temperatures of 300K and 700K, the results obtained being summarized in the following Table 13.

TABLE 13

| | | Substituting elements X | Content of substituting elements a | Dimensionless performance index ZT 300 K | 700 K |
|---|---|---|---|---|---|
| Examples | II-32 | Be | 0.003 | 0.16 | 1.08 |
| | II-33 | Be | 0.01 | 0.17 | 1.12 |
| | II-34 | Be | 0.03 | 0.13 | 1.10 |
| | II-35 | Be | 0.10 | 0.10 | 1.05 |
| | II-36 | Mg | 0.003 | 0.17 | 1.08 |
| | II-37 | Mg | 0.01 | 0.20 | 1.11 |
| | II-38 | Mg | 0.03 | 0.16 | 1.07 |
| | II-39 | Mg | 0.10 | 0.14 | 1.04 |
| | II-40 | Ca | 0.003 | 0.20 | 1.08 |
| | II-41 | Ca | 0.01 | 0.22 | 1.12 |
| | II-42 | Ca | 0.03 | 0.20 | 1.09 |
| | II-43 | Ca | 0.10 | 0.17 | 1.04 |
| | II-44 | Sr | 0.003 | 0.17 | 1.07 |
| | II-45 | Sr | 0.01 | 0.20 | 1.11 |
| | II-46 | Sr | 0.03 | 0.16 | 1.05 |
| | II-47 | Sr | 0.10 | 0.14 | 1.02 |
| | II-48 | Ba | 0.003 | 0.15 | 1.05 |
| | II-49 | Ba | 0.01 | 0.18 | 1.09 |
| | II-50 | Ba | 0.03 | 0.15 | 1.06 |
| | II-51 | Ba | 0.10 | 0.12 | 1.01 |

As shown in Table 13, the thermoelectric materials of various compositions each represented by the formula $(Y_{0.5}Er_{0.5})_{1-a}X_a NiSb$ (wherein X=Be, Mg, Ca, Sr or Ba) were all recognized as having excellent thermoelectric conversion characteristics. Namely, it was confirmed that even the compositions where part of Ln3 and Ln4 of the thermoelectric materials of Examples 11-2 to II-31 was replaced by at least one element selected from the group consisting of Be, Mg, Ca, Sr and Ba were capable of similarly exhibiting excellent thermoelectric characteristics.

Examples II-52 to II-63

Part of Ni in the thermoelectric material represented by a formula of $Y_{0.5}Er_{0.5}NiSb$ was replaced with at least one element selected from the group consisting of Co, Rh and Ir, thereby manufacturing various thermoelectric materials represented by a formula of $(Y_{0.5}Er_{0.5})Ni_{1-b}Z_b Sb$ (Z=Co, Rh or Ir) according to the same procedures as explained in Example II-1. Then, each of these thermoelectric materials was evaluated on the characteristics thereof at temperatures of 300K and 700K, the results obtained being summarized in the following Table 14.

TABLE 14

| | | Substituting elements X | Content of substituting elements a | Dimensionless performance index ZT 300 K | 700 K |
|---|---|---|---|---|---|
| Examples | II-52 | Co | 0.003 | 0.19 | 1.09 |
| | II-53 | Co | 0.01 | 0.21 | 1.13 |
| | II-54 | Co | 0.03 | 0.19 | 1.11 |
| | II-55 | Co | 0.10 | 0.15 | 1.06 |
| | II-56 | Rh | 0.003 | 0.18 | 1.07 |
| | II-57 | Rh | 0.01 | 0.20 | 1.11 |
| | II-58 | Rh | 0.03 | 0.17 | 1.05 |
| | II-59 | Rh | 0.10 | 0.15 | 1.02 |
| | II-60 | Ir | 0.003 | 0.16 | 1.05 |
| | II-61 | Ir | 0.01 | 0.19 | 1.10 |
| | II-62 | Ir | 0.03 | 0.16 | 1.04 |
| | II-63 | Ir | 0.10 | 0.13 | 1.01 |

As shown in Table 14, the thermoelectric materials of various compositions each represented by the formula $(Y_{0.5}Er_{0.5})Ni_{1-b}Z_b Sb$ (Z=Co, Rh or Ir) were all recognized as having excellent thermoelectric conversion characteristics. Namely, it was confirmed that even the compositions where part of Ni of the thermoelectric materials of Examples I-2 to II-31 was replaced by at least one element selected from the group consisting of Co, Rh and Ir were capable of similarly exhibiting excellent thermoelectric characteristics.

The temperature dependency of dimensionless figure-of-merit ZT of the thermoelectric material manufactured in (Example II-53) is shown as a curve "e" in the graph of FIG. 7. The thermoelectric material of Example II-53 was found higher in the dimensionless figure-of-merit ZT as compared with the thermoelectric material of Example II-1. This may presumably be attributed to the fact that decavalent Ni was replaced by nonavalent Co, resulting in an increase in concentration of carrier and hence in a decrease in electrical resistivity of thermoelectric material.

Examples II-64 to II-79

Part of Sb in the thermoelectric material represented by a formula of $Y_{0.5}Er_{0.5}NiSb$ was replaced with at least one element selected from the group consisting of Si, Ge, Sn and Pb, thereby manufacturing various thermoelectric materials represented by a formula of $(Y_{0.5}Er_{0.5})NiSb_{1-C}T_C$ (T=Si, Ge, Sn or Pb) according to the same procedures as explained in Example II-1.

Then, each of these thermoelectric materials was evaluated on the characteristics thereof at temperatures of 300K and 700K, the results obtained being summarized in the following Table 15.

TABLE 15

|  |  | Substituting elements X | Content of substituting elements a | Dimensionless performance index ZT 300 K | Dimensionless performance index ZT 700 K |
|---|---|---|---|---|---|
| Examples | II-64 | Si | 0.003 | 0.15 | 1.06 |
|  | II-65 | Si | 0.01 | 0.17 | 1.09 |
|  | II-66 | Si | 0.03 | 0.14 | 1.05 |
|  | II-67 | Si | 0.10 | 0.12 | 1.01 |
|  | II-68 | Ge | 0.003 | 0.17 | 1.08 |
|  | II-69 | Ge | 0.01 | 0.20 | 1.11 |
|  | II-70 | Ge | 0.03 | 0.19 | 1.06 |
|  | II-71 | Ge | 0.10 | 0.16 | 1.03 |
|  | II-72 | Sn | 0.003 | 0.17 | 1.07 |
|  | II-73 | Sn | 0.01 | 0.22 | 1.11 |
|  | II-74 | Sn | 0.03 | 0.19 | 1.05 |
|  | II-75 | Sn | 0.10 | 0.16 | 1.02 |
|  | II-76 | Pb | 0.003 | 0.15 | 1.05 |
|  | II-77 | Pb | 0.01 | 0.20 | 1.09 |
|  | II-78 | Pb | 0.03 | 0.15 | 1.06 |
|  | II-79 | Pb | 0.10 | 0.12 | 1.01 |

As shown in Table 15, the thermoelectric materials of various compositions each represented by the formula $(Y_{0.5}Er_{0.5})NiSb_{1-C}T_C$ (T=Si, Ge, Sn or Pb) were all recognized as having excellent thermoelectric conversion characteristics. Namely, it was confirmed that even the compositions where part of Sb of the thermoelectric materials of Examples II-2 to II-31 was replaced by at least one element selected from the group consisting of Si, Ge, Sn and Pb were capable of similarly exhibiting excellent thermoelectric characteristics.

Example II-80

By using the thermoelectric material of Example II-53 as a p-type thermoelectric material and the thermoelectric material represented by $(Ti_{0.3}Zr_{0.35}Hf_{0.35})_{0.99}Ta_{0.1}NiSn$ as an n-type thermoelectric material, a thermoelectric element as shown in FIG. 3 was manufactured. Incidentally, this n-type thermoelectric material corresponds to Example I-31.

Each of these p-type and n-type thermoelectric materials was cut into a body 3.0 mm×3.0 mm square in planar configuration and 10.0 mm in height. 60 pieces of p-type thermoelectric bodies and 60 pieces of n-type thermoelectric bodies were alternately arranged in the form of matrix consisting of 10 columns×12 rows. Then, all of 120 pieces were electrically connected in series with an SUS410 electrode board. To the other surface of the silver electrode board, i.e. the surface opposite to the surface to which the thermoelectric element was connected, there was attached an aluminum nitride sintered plate, and furthermore, lead wires were connected to the terminal electrodes, thereby manufacturing the thermoelectric element.

Then, on this thermoelectric element, the power-generating property thereof was evaluated by setting the temperature of upper temperature side to 570° C. and the temperature of lower temperature side to 55° C. The internal resistance of this thermoelectric conversion module was found to be 1.51Ω under these temperature conditions. The power-generating property of this thermoelectric element was measured under a matched load condition where the load connected thereto was set to 1.51Ω which was the same as that of the internal resistance of thermoelectric conversion module. As a result, the voltage generated was 5.68V, and an electric current of 3.76 A was permitted to flow, thereby obtaining an electric power of 21.3 W, thus confirming an excellent power-generating property as a thermoelement.

Example II-81

A thermoelectric element was manufactured by following the same procedures as explained in the aforementioned Example II-80 except that the n-type thermoelectric material was changed to a thermoelectric material represented by $Ce_{0.2}(Co_{0.97}Pd_{0.03})_4Sb_{12}$. Incidentally, this n-type thermoelectric material employed herein was a conventional material where the major phase thereof was not constituted by a half Heusler compound.

Then, on this thermoelectric element, the power-generating property thereof was evaluated under the same conditions as those of Example II-80. The internal resistance of this thermoelectric conversion module was found 1.23Ω under these temperature conditions. The power-generating property of this thermoelectric element was measured under a matched load condition where the load connected thereto was set to 1.23Ω which was the same as that of the internal resistance of thermoelectric conversion module. As a result, the voltage generated was 4.87V, and an electric current of 3.96 A was permitted to flow, thereby obtaining an electric power of 19.3 W, thus confirming the generation of electric power.

Conventional Example

A thermoelectric element was manufactured by following the same procedures as explained in the aforementioned Example II-81 except that the p-type thermoelectric material was changed to a thermoelectric material represented by $CeCoFe_3Sb_{12}$. Incidentally, this p-type thermoelectric material employed herein was a conventional material where the major phase thereof was not constituted by a half Heusler compound.

Then, on this thermoelectric element, the power-generating property thereof was evaluated under the same conditions as those of Example II-80. The internal resistance of this thermoelectric conversion module was found 1.43Ω under these temperature conditions. The power-generating property of this thermoelectric element was measured under a matched load condition where the load connected thereto was set to 1.43Ω which was the same as that of the internal resistance of thermoelectric conversion module. As a result, the voltage generated was 4.80V, and an electric current of 3.37 A was permitted to flow, thereby making it possible to retain an electric power of 16.1 W, thus confirming the generation of electric power.

As explained above, according to one embodiment of the present invention, it is possible to provide a thermoelectric material comprising as a major phase a half Heusler compound and to provide a thermoelectric element employing such a thermoelectric material, this thermoelectric material being featured in that it is capable of exhibiting a high dimensionless figure-of-merit ZT while making it possible to sufficiently suppress the heat conductivity and to maintain a high Seebeck coefficient and a low electric resistivity.

It is possible according to the present invention to obtain a thermoelectric material which is free from highly noxious elements, is excellent in safety, is low in manufacturing cost, and is excellent in performance as a thermoelectric material. Through the employment of this thermoelectric material, it is now possible to easily manufacture a thermoelectric element and thermoelectric conversion module, and hence the present invention would be very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric material which is represented by the following composition formula (3):

$Ln1_X Ni_Y Sb_{100-X-Y}$, wherein Ln1 is at least two elements selected from the group consisting of Sc, Y, Gd, Tb, Dy, Ho, Er, Tm, Yb, Lu, Th and U; and X and Y satisfy the following conditions:

30≤X≤35 and 30≤Y≤35, respectively, wherein the thermoelectric material comprises as a major phase an MgAgAs type crystal structure.

2. The thermoelectric material according to claim 1, wherein Ln1 in said composition formula (3) is partially replaced by at least one element selected from the group consisting of Ti, Zr, Hf, La, Ce, Pr, Nd, Sm, Eu, Be, Mg, Ca, Sr and Ba.

3. The thermoelectric material according to claim 1, wherein Ni in said composition formula (3) is partially replaced by at least one element selected from the group consisting of V, Nb, Ta, Cr, Mo, W, Mn, Fe, Co, Rh, Ir, Pb, Pt, Cu, Ag, Au and Zn.

4. The thermoelectric material according to claim 1, wherein Sb in said composition formula (3) is partially replaced by at least one element selected from the group consisting of Al, Si, Ga, Ge, As, In, Sn, Pb and Bi.

5. A thermoelectric element comprising:
a p-type thermoelectric material and
a n-type thermoelectric material,
wherein said p-type and n-type thermoelectric materials are alternately connected with each other in series, and wherein the p-type thermoelectric material comprises the thermoelectric material according to claim 1.

6. The thermoelectric material according to claim 1, wherein Ln1 comprises a pair of two elements selected from the group consisting of Sc, Y, Gd, Tb, Dy, Ho, Er, Tm, Yb, Lu, Th and U.

7. The thermoelectric material according to claim 6, wherein the pair of two elements is at least one pair selected from the group consisting of Y and Er, Y and Gd, Y and Tb, Y and Dy, Y and Ho, Y and Yb, Gd and Tb, Gd and Dy, Gd and Ho, Gd and Er, Gd and Yb, Tb and Dy, Tb and Ho, Tb and Er, Tb and Yb, Dy and Ho, Dy and Er, Dy and Yb, and Er and Yb.

8. The thermoelectric material according to claim 5, wherein at least one of the p-type and n-type thermoelectric material is a sintered body.

9. The thermoelectric material according to claim 8, wherein the sintered body is obtained by melting raw materials to obtain melted raw materials, quenching the melted raw materials to obtain an alloy formed of a metallic lump, pulverizing the alloy to obtain an alloy powder, and monolithic molding the alloy powder by sintering, hot press or a SPS method.

10. The thermoelectric material according to claim 9, wherein the sintered body has a dimensionless figure-of-merit ZT value of not less than 0.01 at 300 K.

* * * * *